(12) United States Patent
Groe et al.

(10) Patent No.: US 7,672,648 B1
(45) Date of Patent: Mar. 2, 2010

(54) SYSTEM FOR LINEAR AMPLITUDE MODULATION

(75) Inventors: John Groe, Poway, CA (US); Naone Farias, San Diego, CA (US); Burcin Baytekin, San Diego, CA (US); Carrie Lo, Newport Beach, CA (US)

(73) Assignee: Quintics Holdings, Santa Clara, CA (US)

( * ) Notice: Subject to any disclaimer, the term of this patent is extended or adjusted under 35 U.S.C. 154(b) by 1040 days.

(21) Appl. No.: 11/167,943

(22) Filed: Jun. 27, 2005

Related U.S. Application Data

(60) Provisional application No. 60/583,431, filed on Jun. 26, 2004.

(51) Int. Cl.
*H01Q 11/12* (2006.01)
*H04B 1/04* (2006.01)

(52) U.S. Cl. .................. 455/127.2; 455/126; 330/98; 330/127

(58) Field of Classification Search .............. 455/108, 455/109, 126, 127.1, 127.2, 127.3; 330/83, 330/98, 127, 200
See application file for complete search history.

(56) References Cited

U.S. PATENT DOCUMENTS

| | | | |
|---|---|---|---|
| 4,263,560 A | 4/1981 | Ricker |
| 4,430,627 A | 2/1984 | Machida |
| 4,769,588 A | 9/1988 | Panther |
| 4,816,772 A | 3/1989 | Klotz |
| 4,926,135 A | 5/1990 | Voorman |
| 4,965,531 A | 10/1990 | Riley |
| 5,006,818 A | 4/1991 | Koyama et al. |
| 5,015,968 A | 5/1991 | Podell et al. |
| 5,030,923 A | 7/1991 | Arai |
| 5,289,136 A | 2/1994 | DeVeirman et al. |
| 5,331,292 A | 7/1994 | Worden et al. |
| 5,399,990 A | 3/1995 | Miyake |
| 5,491,450 A | 2/1996 | Helms et al. |
| 5,508,660 A | 4/1996 | Gersbach et al. |
| 5,548,594 A | 8/1996 | Nakamura |
| 5,561,385 A | 10/1996 | Choi |
| 5,581,216 A | 12/1996 | Ruetz |
| 5,625,325 A | 4/1997 | Rotzoll et al. |
| 5,631,587 A | 5/1997 | Co et al. |
| 5,648,744 A | 7/1997 | Prakash et al. |
| 5,677,646 A | 10/1997 | Entrikin |
| 5,739,730 A | 4/1998 | Rotzoll |
| 5,767,748 A | 6/1998 | Nakao |
| 5,818,303 A | 10/1998 | Oishi et al. |
| 5,834,987 A | 11/1998 | Dent |
| 5,862,465 A | 1/1999 | Ou |
| 5,878,101 A | 3/1999 | Aisaka |
| 5,880,631 A | 3/1999 | Sahota |
| 5,939,922 A | 8/1999 | Umeda |

(Continued)

*Primary Examiner*—Edward Urban
*Assistant Examiner*—Christian A Hannon
(74) *Attorney, Agent, or Firm*—BlairTech Solution LLC

(57) ABSTRACT

System for linear amplitude modulation. Apparatus is provided for linear amplitude modulation of an amplifier. The apparatus includes a processing circuit that receives an amplitude modulation signal and produces one or more amplifier control signals that are coupled to the amplifier. The apparatus also includes a feedback circuit that generates a feedback signal from an output of the amplifier that is input to the processing circuit; and a network that controls a bias of the amplifier in response to the feedback signal to linearize the amplifier's amplitude control.

42 Claims, 19 Drawing Sheets

U.S. PATENT DOCUMENTS

| | | | |
|---|---|---|---|
| 5,945,855 | A | 8/1999 | Momtaz |
| 5,949,286 | A | 9/1999 | Jones |
| 5,990,740 | A | 11/1999 | Groe |
| 5,994,959 | A | 11/1999 | Ainsworth |
| 5,999,056 | A | 12/1999 | Fong |
| 6,011,437 | A | 1/2000 | Sutardja et al. |
| 6,018,651 | A | 1/2000 | Bruckert et al. |
| 6,031,425 | A | 2/2000 | Hasegawa |
| 6,044,124 | A | 3/2000 | Monahan et al. |
| 6,052,035 | A | 4/2000 | Nolan et al. |
| 6,057,739 | A | 5/2000 | Crowley et al. |
| 6,060,935 | A | 5/2000 | Shulman |
| 6,091,307 | A | 7/2000 | Nelson |
| 6,100,767 | A | 8/2000 | Sumi |
| 6,114,920 | A | 9/2000 | Moon et al. |
| 6,163,207 | A | 12/2000 | Kattner et al. |
| 6,173,011 | B1 | 1/2001 | Rey et al. |
| 6,191,956 | B1 | 2/2001 | Foreman |
| 6,204,728 | B1 | 3/2001 | Hageraats |
| 6,211,737 | B1 | 4/2001 | Fong |
| 6,229,374 | B1 | 5/2001 | Tammone, Jr. |
| 6,246,289 | B1 | 6/2001 | Pisati et al. |
| 6,255,889 | B1 | 7/2001 | Branson |
| 6,259,321 | B1 | 7/2001 | Song et al. |
| 6,288,609 | B1 | 9/2001 | Brueske et al. |
| 6,298,093 | B1 | 10/2001 | Genrich |
| 6,333,675 | B1 | 12/2001 | Saito |
| 6,370,372 | B1 | 4/2002 | Molnar et al. |
| 6,392,487 | B1 | 5/2002 | Alexanian |
| 6,404,252 | B1 | 6/2002 | Wilsch |
| 6,476,660 | B1 | 11/2002 | Visocchi et al. |
| 6,515,553 | B1 | 2/2003 | Filiol et al. |
| 6,559,717 | B1 | 5/2003 | Lynn et al. |
| 6,560,448 | B1 | 5/2003 | Baldwin et al. |
| 6,571,083 | B1 | 5/2003 | Powell, II et al. |
| 6,577,190 | B2 | 6/2003 | Kim |
| 6,583,671 | B2 | 6/2003 | Chatwin |
| 6,583,675 | B2 | 6/2003 | Gomez |
| 6,639,474 | B2 | 10/2003 | Asikainen et al. |
| 6,664,865 | B2 | 12/2003 | Groe et al. |
| 6,683,509 | B2 | 1/2004 | Albon et al. |
| 6,693,977 | B2 | 2/2004 | Katayama et al. |
| 6,703,887 | B2 | 3/2004 | Groe |
| 6,711,391 | B1 | 3/2004 | Walker et al. |
| 6,724,235 | B2 | 4/2004 | Costa et al. |
| 6,734,736 | B2 | 5/2004 | Gharpurey |
| 6,744,319 | B2 | 6/2004 | Kim |
| 6,751,272 | B1 | 6/2004 | Burns et al. |
| 6,753,738 | B1 | 6/2004 | Baird |
| 6,763,228 | B2 | 7/2004 | Prentice et al. |
| 6,774,740 | B1 | 8/2004 | Groe |
| 6,777,999 | B2 | 8/2004 | Kanou et al. |
| 6,781,425 | B2 | 8/2004 | Si |
| 6,795,843 | B1 | 9/2004 | Groe |
| 6,798,290 | B2 | 9/2004 | Groe et al. |
| 6,801,089 | B2 | 10/2004 | Costa et al. |
| 6,845,139 | B2 | 1/2005 | Gibbons |
| 6,856,205 | B1 | 2/2005 | Groe |
| 6,870,411 | B2 | 3/2005 | Shibahara et al. |
| 6,917,791 | B2 | 7/2005 | Chadwick |
| 6,940,356 | B2 | 9/2005 | McDonald, II et al. |
| 6,943,600 | B2 | 9/2005 | Craninckx |
| 6,975,687 | B2 | 12/2005 | Jackson et al. |
| 6,985,703 | B2 | 1/2006 | Groe et al. |
| 6,990,327 | B2 | 1/2006 | Zheng et al. |
| 7,062,248 | B2 | 6/2006 | Kuiri |
| 7,065,334 | B1 | 6/2006 | Otaka et al. |
| 7,088,979 | B1 | 8/2006 | Shenoy et al. |
| 7,123,102 | B2 | 10/2006 | Uozumi et al. |
| 7,142,062 | B2 | 11/2006 | Vaananen et al. |
| 7,148,764 | B2 | 12/2006 | Kasahara et al. |
| 7,171,170 | B2 | 1/2007 | Groe et al. |
| 7,215,215 | B2 | 5/2007 | Hirano et al. |
| 2002/0071497 | A1 | 6/2002 | Bengtsson et al. |
| 2002/0135428 | A1 | 9/2002 | Gomez |
| 2002/0193009 | A1 | 12/2002 | Reed |
| 2003/0078016 | A1 | 4/2003 | Groe et al. |
| 2003/0092405 | A1 | 5/2003 | Groe et al. |
| 2003/0118143 | A1 | 6/2003 | Bellaouar et al. |
| 2003/0197564 | A1 | 10/2003 | Humphreys et al. |
| 2004/0017862 | A1 | 1/2004 | Redman-White |
| 2004/0051590 | A1 | 3/2004 | Perrott et al. |
| 2005/0093631 | A1 | 5/2005 | Groe |
| 2005/0099232 | A1 | 5/2005 | Groe et al. |
| 2005/0208907 | A1* | 9/2005 | Yamazaki et al. ........... 455/126 |
| 2006/0003720 | A1 | 1/2006 | Lee et al. |

* cited by examiner

SYSTEM FOR LINEAR AMPLITUDE MODULATION

CROSS REFERENCE TO RELATED APPLICATIONS

This Application claims the benefit of priority from a co-pending U.S. Provisional Application entitled, "Linear Amplitude Modulation" having application No. 60/583,431 and filed on Jun. 26, 2004, the disclosure of which is incorporated herein by reference for all purposes.

FIELD

This application relates generally to power amplifiers, and more particularly, to a system for efficient and highly linear amplitude modulation.

BACKGROUND

Modern communication systems increasingly employ modulation methods such as 8-PSK, 16-QAM, 64-QAM, and OFDM to increase data speeds and to improve spectrum efficiency. This added complexity invariably increases the amplitude (or envelope) fluctuations of the transmit signal—generally measured by the transmit signal's peak-to-average (pk/ave) ratio. As a result, the radio transmitter sees higher peaks and tends to generate more distortion. To minimize distortion, most linear circuits operate at a bias current proportional to the largest amplitude or peak of the transmit signal. This can be very inefficient in systems that produce signals with a large peak-to-average ratio.

A radio transmitter generally uses a power amplifier to close the link to the receiver. The power amplifier typically dissipates more power than any other circuit so its efficiency is critical. It would therefore be advantageous to have a system for operating a power amplifier at lower power levels while keeping distortion low.

SUMMARY

In one or more embodiments, a system for linear amplitude modulation is provided. In one embodiment, the system comprises a very efficient amplifier that can be used with any type of modulated signal, including signals modulated with constant and envelope-varying techniques.

In one embodiment, apparatus is provided for linear amplitude modulation of an amplifier. The apparatus comprises a processing circuit that receives an amplitude modulation signal and produces one or more amplifier control signals that are coupled to the amplifier. The apparatus also comprises a feedback circuit that generates a feedback signal from an output of the amplifier that is input to the processing circuit, and a network that controls a bias of the amplifier in response to the feedback signal to linearize the amplifier's amplitude control.

In one embodiment, apparatus is provided for linear amplitude modulation of an amplifier. The apparatus comprises means for receiving an amplitude modulation signal and producing one or more amplifier control signals that are coupled to the amplifier. The apparatus also comprises means for generating a feedback signal from an output of the amplifier that is input to the means for receiving, and means for controlling a bias of the amplifier in response to the feedback signal to linearize the amplifier's amplitude control.

Other aspects of the embodiments will become apparent after review of the hereinafter set forth Brief Description of the Drawings, Detailed Description, and the Claims.

BRIEF DESCRIPTION OF THE DRAWINGS

The foregoing aspects of the embodiments described herein will become more readily apparent by reference to the following detailed description when taken in conjunction with the accompanying drawings wherein.

DETAILED DESCRIPTION

Figure 1:
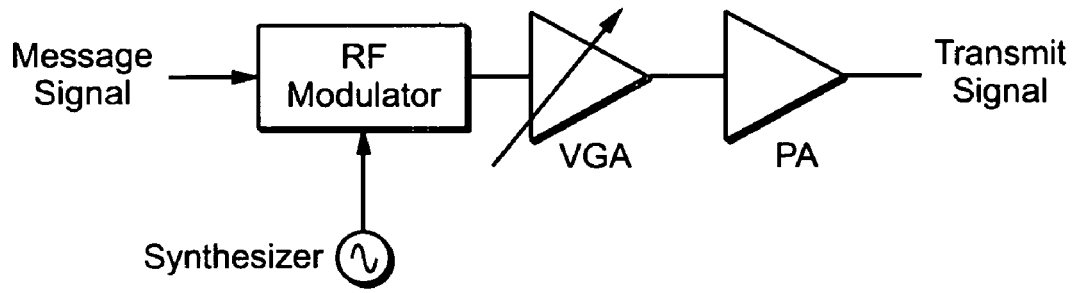
FIG. 1 shows a block diagram of a radio transmitter.

FIG. 1 shows a block diagram of a radio transmitter. It includes an RF modulator, synthesizer, variable gain amplifier (VGA), and power amplifier (PA). The RF modulator up-converts a message signal to an RF carrier signal created by the synthesizer, which then drives the variable gain amplifier and power amplifier to produce a transmit signal. With this architecture, both the variable gain amplifier and the power amplifier need to operate linearly with high efficiency.

It's important that the power amplifier and each gain stage operate linearly at the peaks of the transmit signal. This situation places the greatest demands on the power amplifier and actually defines its operating parameters as described below.

Figure 2:
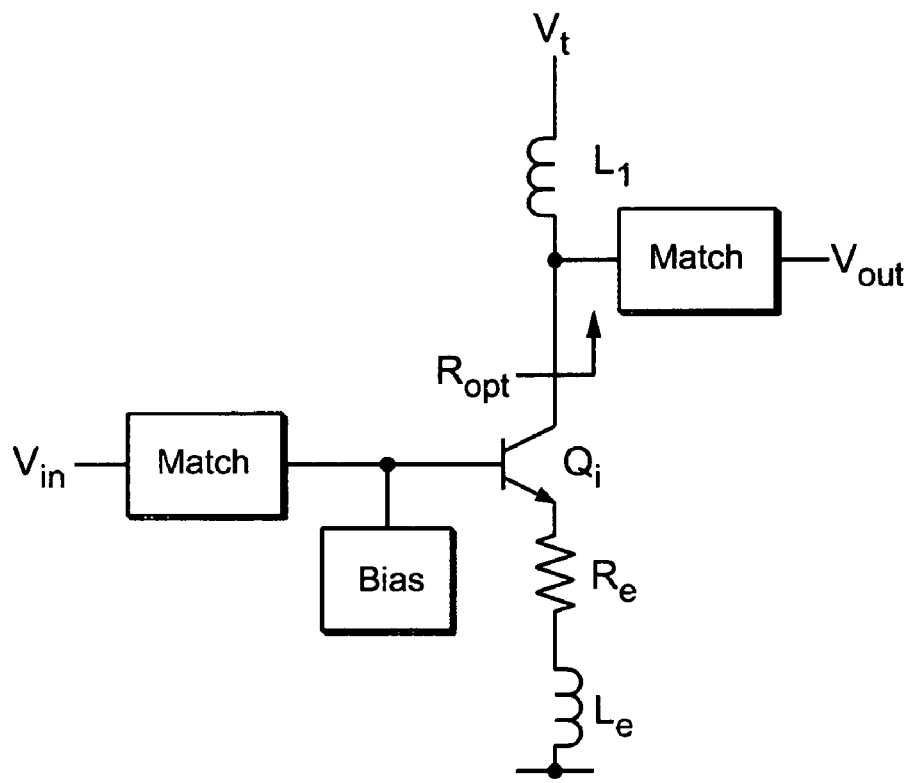
FIG. 2 shows a power amplifier gain stage.

FIG. 2 shows a power amplifier gain stage. It includes input and output matching networks and uses an RF choke (inductor $L_1$) to allow the output voltage $V_{out}$ to swing above the positive supply $V_+$. The output voltage swing is maximized when the optimum load resistance ($R_{opt}$) is presented to the gain stage and thus;

$$R_{opt} = \frac{2V_+}{I_{max}}$$

where $I_{max}$ is the maximum collector current of transistor $Q_1$. The maximum current is important because, in practice, the active device ($Q_1$) should operate at a nominal level that is about one-half the maximum level to ensure linear operation.

Figure 3:
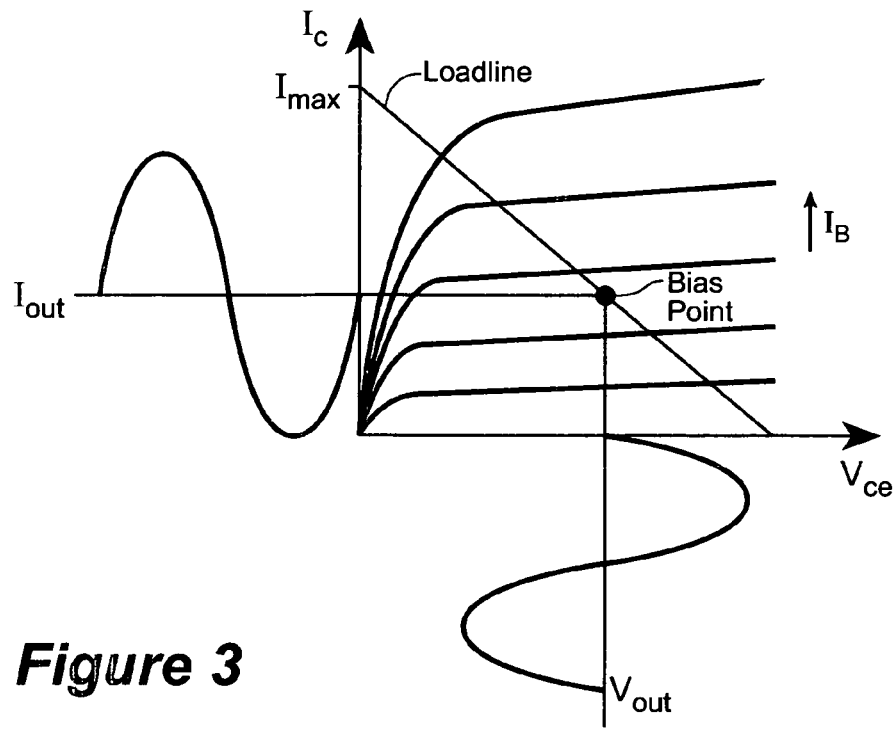
FIG. 3 shows a graph that illustrates transistor output curves for the power amplifier shown in FIG. 2 when driven by a sinusoidal input waveform.

FIG. 3 shows a graph that illustrates transistor output curves for the power amplifier shown in FIG. 2 when driven by a sinusoidal input waveform. At the nominal level, the output current flows continuously or nearly continuously. It follows that the loadline resistance ($R_{opt}$) and maximum current ($I_{max}$) are therefore defined by;

$$R_{opt} \frac{(2V_+)^2}{P_{out(pk)}} \text{ and } I_{max} = \frac{2V_+}{R_{opt}}$$

where $P_{out(pk)}$ is the instantaneous peak output power.

At lower power levels and smaller signal peaks, it's possible to reduce the nominal operating current of the active device. However, it's important to keep the loadline resistance fixed, otherwise the output match and performance of the power amplifier suffers.

The efficiency of an amplifier is defined as an amplifier's ability to convert dc (or battery) power to radio energy;

$$\eta = \frac{P_{RF}}{P_{dc}}$$

where $P_{RF}$ is the RF output power and $P_{dc}$ is the dc power used. The described linear amplifier—with continuous output current flow—achieves at best 50% efficiency. It's possible to lower the dc power used and thereby improve efficiency by limiting the time the output current flows.

Figure 4:
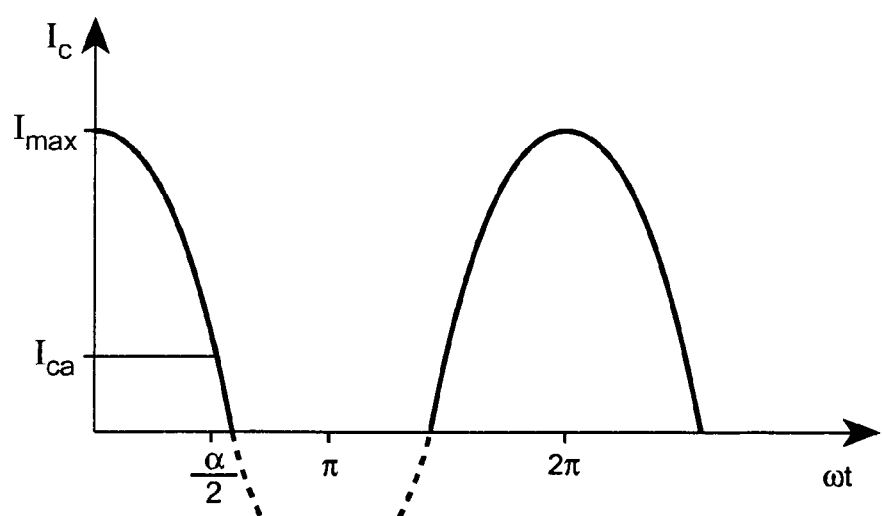
FIG. 4 shows a graph that illustrates various operating modes for an amplifier.

FIG. 4 shows a graph that illustrates various operating nodes for an amplifier. For example, the graph shows how efficiency may be improved by limiting the time the output current flows in an amplifier. Here, the conduction angle—defined as twice the cutoff point of the waveform—indicates the amount of time the output current flows for a sinusoidal signal. It follows that the conduction angle is $2\pi$ for class A operation (current flows continuously), from $\pi$ to $2\pi$ for class AB mode, exactly $\pi$ for class B bias, and less than $\pi$ for class C operation.

The operating point of RF amplifiers can also be affected by the input signal. This effect, known as self-bias, occurs at large input signal amplitudes. The large signal peaks exponentially increase the transistor's output current. This phenomenon potentially compensates for typical gain compression effects and therefore actually helps class AB amplifiers operate more linearly than class A amplifiers.

Class B and C amplifiers are generally labeled switched amplifiers since the active device is turned on and off. As a result, this type of amplifier is inherently nonlinear and therefore unsuitable for use with most digitally modulated signals. It is however very efficient. Furthermore, its efficiency remains almost constant at different output power levels. This contrasts with linear amplifiers, where the efficiency falls off dramatically at low to moderate power levels.

Figure 5:
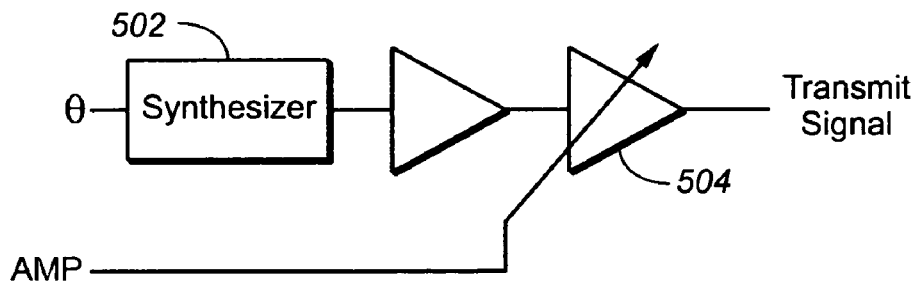
FIG. 5 shows a block diagram of a polar modulator.

FIG. 5 shows a block diagram of a polar modulator. The overall efficiency of the radio transmitter improves when a polar modulation architecture is used. This type of architecture separates the message signal into equivalent phase and amplitude components, allowing direct phase modulation at the synthesizer 502 and amplitude modulation at the power amplifier 504 as shown in FIG. 5. It advantageously eliminates mixer circuits and enables the use of nonlinear and more efficient compressed amplifiers.

Figure 6:
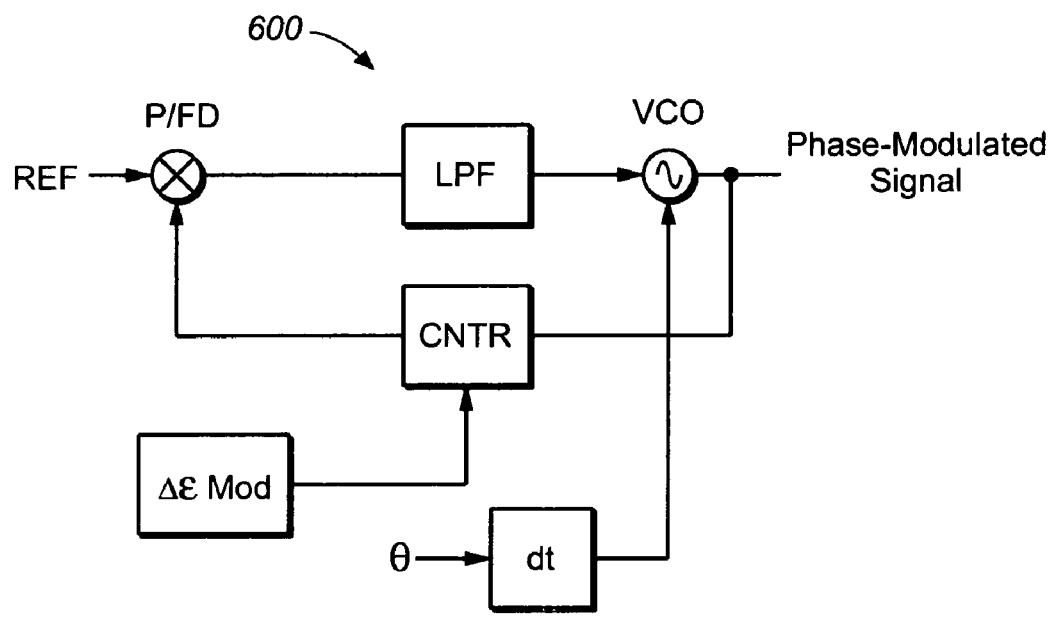
FIG. 6 shows a block diagram of a phase/frequency synthesizer for use with a polar modulator.

FIG. 6 shows a block diagram of a phase/frequency synthesizer 600 for use with a polar modulator. For example, the synthesizer 600 shown in FIG. 6 is suitable for use as the synthesizer 502 shown in FIG. 5. The synthesizer 600 comprises a phase modulator that utilizes a fractional-N phase-locked loop (PLL) and dual-port voltage-controlled oscillator (VCO). The separate VCO ports are used to set the RF carrier frequency and to inject phase/frequency modulation. This eases the design since their responses can be independently optimized. Since the frequency modulation is applied directly to the VCO, it's important for the modulation port to be very linear. It is also important to use a correction signal to offset feedback effects and thus to allow direct modulation.

The output of the synthesizer 600 at the VCO is a constant-envelop phase-modulated signal. Ideally, this signal is buffered using compressed amplifiers and then connected to the power amplifier, whereat amplitude modulation is applied. For example, the phase-modulated signal may be applied to the power amplifier 504 shown in FIG. 5. In practice, the amplitude modulation is applied either through the supply or via a bias network. Each approach has its own advantages and issues as described below.

Figure 7:
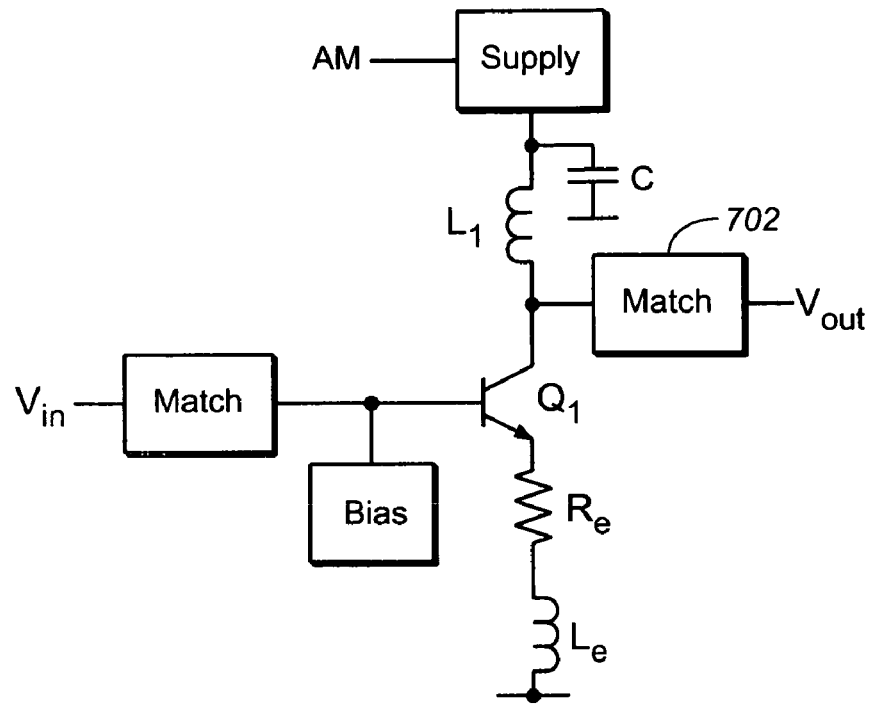
FIG. 7 shows a diagram of an amplifier that supports amplitude modulation through the supply.

FIG. 7 shows a diagram of an amplifier that provides amplitude modulation through the supply. The amplitude modulation is applied at the positive supply as shown in FIG. 7. Since the loadline resistance is fixed by the output matching network 702, the output power ($P_{out}$) simply becomes proportional to the supply voltage and is expressed as;

$$P_{out} = \frac{V_{am}^2}{R_{opt}}$$

where $V_{am}$ is the amplitude modulation (AM) signal. This relationship is extremely linear—even more so than the gain relationship of class A/AB amplifiers. Unfortunately, as the amplitude modulation voltage $V_{am}$ is reduced, the gain stage and active device eventually saturate. This proves problematic for bipolar transistors (because it forward biases the base-collector junction which may harm the device) and for field effect transistors (since the device pushes into its linear region where its gain drops). Therefore the collector voltage for bipolar transistors and the drain voltage of field affect transistors must be limited. Severe phase shifts to the signal also occur near saturation and must be avoided because these produce spectral re-growth. As a result, the useful range for this type of amplitude modulation is approximately 20 dB.

Figure 8:
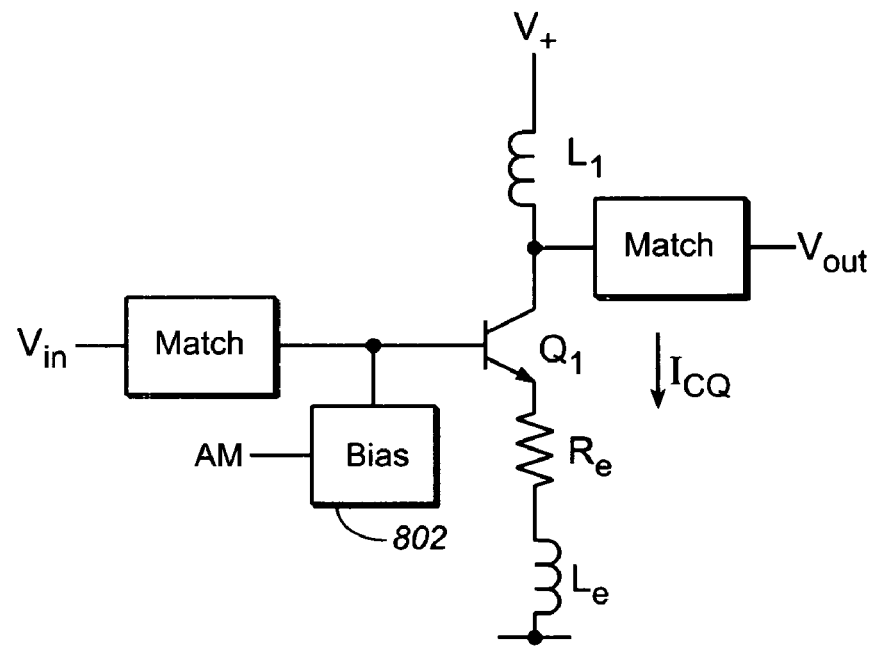
FIG. 8 shows a diagram of an amplifier that supports amplitude modulation through a bias network.

FIG. 8 shows a diagram of an amplifier that supports amplitude modulation through a bias network. For example, amplitude modulation is introduced through the amplifier's bias network 802, and this affects its linear gain. This is partly because the small-signal gain of a bipolar transistor ($g_m$) tracks its collector bias current ($I_{CQ}$); although, at larger signal levels other effects such as gain compression and self-bias take over. As such, the gain of an amplifier stage depends on both the bias current and the input signal amplitude—which becomes a complex relationship at large signal levels. Nevertheless, bias control supports an amplitude modulation range of approximately 20 dB.

Some modern communication systems such as CDMA and OFDM bundle multiple carriers together to deliver high data rates. This tends to increase the fluctuations in the transmit signal and generally produces very large peaks. As a result, the dynamic range of the amplitude modulation signal can reach 40 dB.

It's clear that amplitude modulation by a single stage amplifier—either through the supply or bias network—falls short of the requirements set by modern communication systems. This problem becomes even more acute when adaptive power control needs are considered. That's because the ideal point for amplitude modulation changes. At high output power levels, the amplitude modulation is best applied at the last stages of the power amplifier. In this way, the preceding gain stages can operate nonlinearly and thus very efficiently. As the output power of the radio transmitter decreases, the ability to apply amplitude modulation through the last power amplifier stage disappears. This is because an amplifier possesses an absolute lower limit to its modulation range (due to saturation and phase linearity) as well as it generally offers very little control at low power levels. Consequently, the amplitude modulation must shift to earlier gain stages and this further complicates the situation.

The amplitude modulation shift impacts both switched (FIG. 7) and linear (FIG. 8) power amplifiers. For switched amplifiers at high power levels, the input drive must be strong enough to fully switch the amplifier. In contrast, at low power levels, the input signal must be small enough to allow the switched amplifier to operate linearly. For linear amplifiers, the situation is somewhat different. At high power levels, the power amplifier is self-biased and as such the bias network is unable to affect the amplifier's gain. This means the input power must decrease initially (before the amplifier's gain is adjusted) and must continually shrink as the amplifier's gain is reduced. Otherwise, the amplifier will distort the input signal. Regardless of the approach, amplitude modulation must be linear. This dictates a system with calibration and/or feedback.

Figure 9:
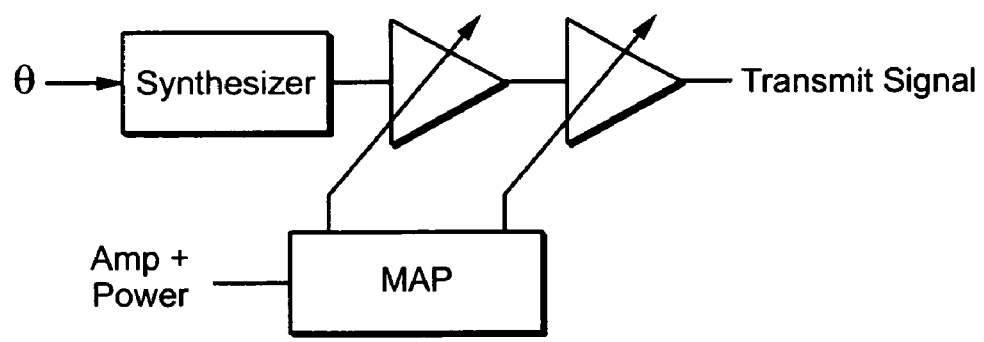
FIG. 9 shows one embodiment of a polar modulator with system calibration for improved amplitude modulation.

FIG. 9 shows one embodiment of a polar modulator with system calibration for improved amplitude modulation. The system calibration comprises a mapping function (MAP) that maps an amplitude modulation signal to control signals having the appropriate values needed to linearly control one or more power amplifier gain stages. The mapping function introduces pre-distortion and supports open-loop operation. But, the mapping function differs for each power amplifier and therefore utilizes several measurements. Effects from temperature and frequency should also be minimized.

Figure 10:
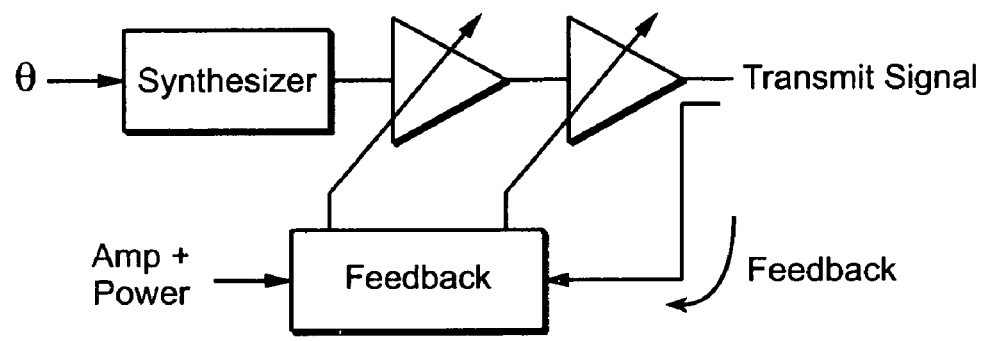
FIG. 10 shows another embodiment of a polar modulator that comprises a feedback circuit for improved amplitude modulation.

FIG. 10 shows another embodiment of a polar modulator that comprises a feedback circuit for improved amplitude modulation. The feedback circuit provides a feedback loop that creates closed-loop control of the output power level. As such, the amplitude modulation signal(s) are corrected to drive the output signal to the proper amplitude. This feedback loop becomes challenging for wide dynamic range systems and even more complicated for elaborate systems needing phase/amplitude tracking.

In one embodiment, the feedback circuit operates to provide a feedback loop that operates around a group comprising the high-power amplifier stages, since these stages are difficult to predict (sensitive to input signal amplitude, supply voltage, and bias current). This requires the response of the variable gain amplifier(s) to be linear or at least very predictable, which is practical with variable attenuators and current-steered variable gain amplifiers.

Figure 11:
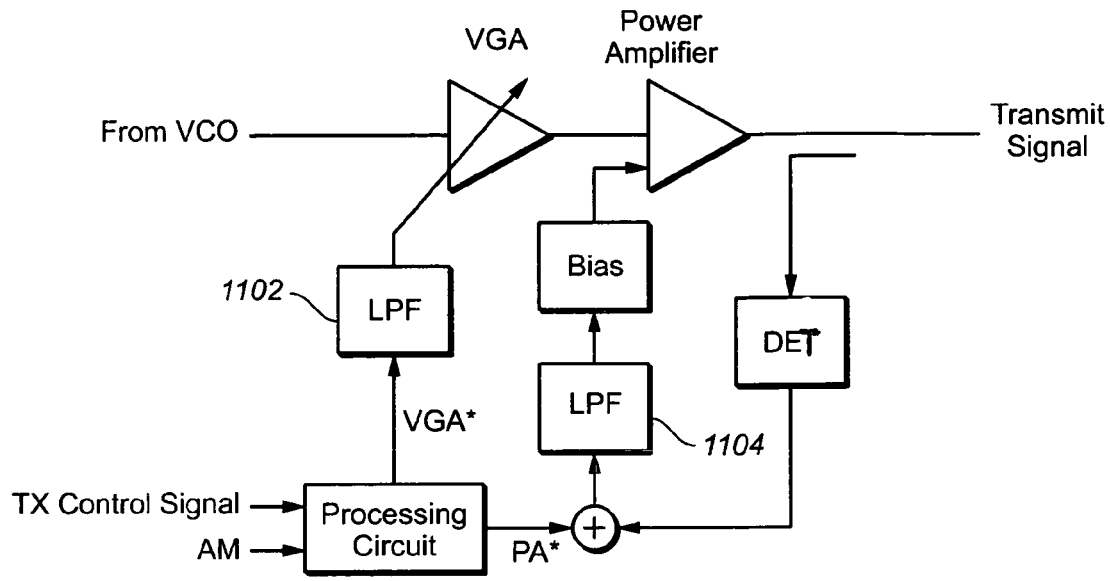
FIG. 11 shows one embodiment of an amplitude modulation architecture that comprises a feedback loop.

FIG. 11 shows one embodiment of an amplitude modulation architecture that comprises a feedback loop. The feedback loop comprises a detector (DET), signal processing circuit, a pair of low pass filters (LPF) (1102, 1104), a bias circuit (Bias), and a summing circuit (+). The feedback loop operates to generate control signals that are used to control the operation of a VGA and power amplifier. The detector operates over the gain control range of the amplifier stages enclosed by the feedback loop. In practice, it is the detector range that limits the maximum control range of the power amplifier. The amplitude modulation drives two points—one which sets the input level to the power amplifier by controlling the VGA, and a second which controls the power amplifier. In essence, the processing circuit split the amplitude modulation signal (AM) into the two control signals (VGA* and PA*). In one or more embodiments, the feedback loop operates with either of the amplitude modulation approaches discussed above—supply or bias.

In one embodiment, the signal processing circuit actually slides the amplitude modulation, depending on the transmit output power level set by the TX control signal. The processing circuit also considers two important power levels that describe the power amplifier. The first level ($P_1$) indicates the power level where the control through the supply or bias network becomes practical. It's related to the amplifier's design and varies with the peak-to-average ratio of the transmit waveform, which is readily available from the digital modulator using the radio configuration parameters or by means of some straightforward analysis. (Note that $P_1$ is the maximum output power level for the switched amplifier, but somewhat less for the linear amplifier due to self-bias effects.) The second level ($P_2$) marks the absolute lower limit of the power amplifier's modulation range;

$$P_2 = P_{MAX} - \Delta P_2$$

where $P_{MAX}$ identifies the maximum output power level and $\Delta P_2$ corresponds to the detector range.

Figure 12A:
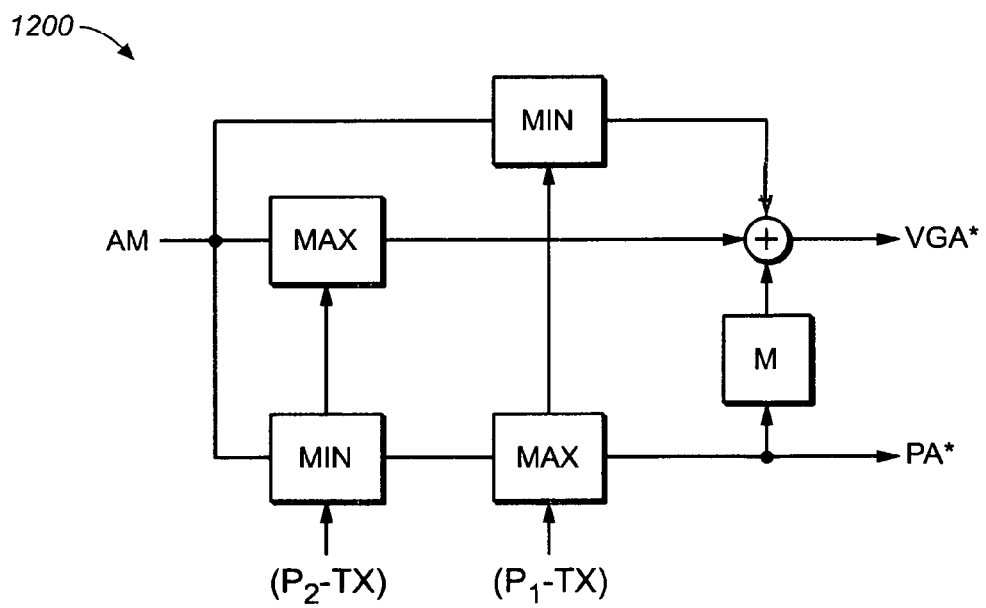
FIGS. 12a-d show a detailed diagram of one embodiment of a processing circuit for use in the modulation architecture of FIG. 11, and associated graphs.

FIG. 12a shows one embodiment of a processing circuit 1200 suitable for use in the amplitude modulation architecture shown in FIG. 11. The processing circuit 1200 uses minimum (min) and maximum (max) functions to properly steer and scale the amplitude modulation signal (AM). These functions limit both the low and high ends of the AM signal routed to the power amplifier control signal (PA*). Its minimum threshold is $P_2$—TX while its maximum threshold is $P_1$-TX. As a result the PA* control signal is defined as;

$$PA^* = \begin{cases} P_2 & \text{for } AM < (P_2 - TX) \\ AM + TX & \text{for } (P_2 - TX) \geq AM \leq (P_1 - TX) \\ P_1 & \text{for } AM > (P_1 - TX) \end{cases}$$

which essentially describes the AM signal in the range of $P_1$ to $P_2$.

The min and max functions also scale the AM signal to produce the variable gain amplifier control signal (VGA*). The VGA* control signal primarily covers the range outside of $P_1$ to $P_2$, but it also affects the range from $P_1$ to $P_2$. In this region, it varies the input signal to the power amplifier by using a scaled version of the PA* signal, resulting in;

$$VGA^* = \begin{cases} AM & \text{for } AM < (P_2 - TX) \\ P_2 + \mu(PA^*) & \text{for } (P_2 - TX) \geq AM \leq (P_1 - TX) \\ P_2 + \mu(\Delta P_2) + (AM - P_1) & \text{for } AM > (P_1 - TX) \end{cases}$$

where $\mu$ is the scaling factor. It's possible that the scaling factor better fits a logarithmic function whereby the VGA* signal becomes;

$$\mu(PA^*) \rightarrow (PA^*)^\mu$$

In either case, the scaling factor $\mu$ is always less than one.

Figure 12B:
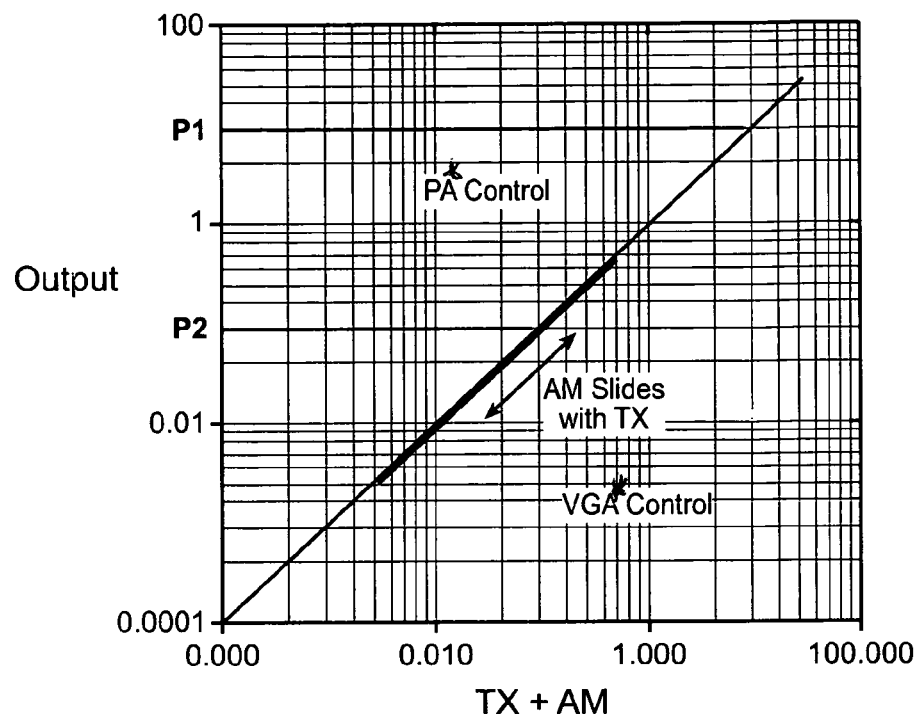
Figure 12C:
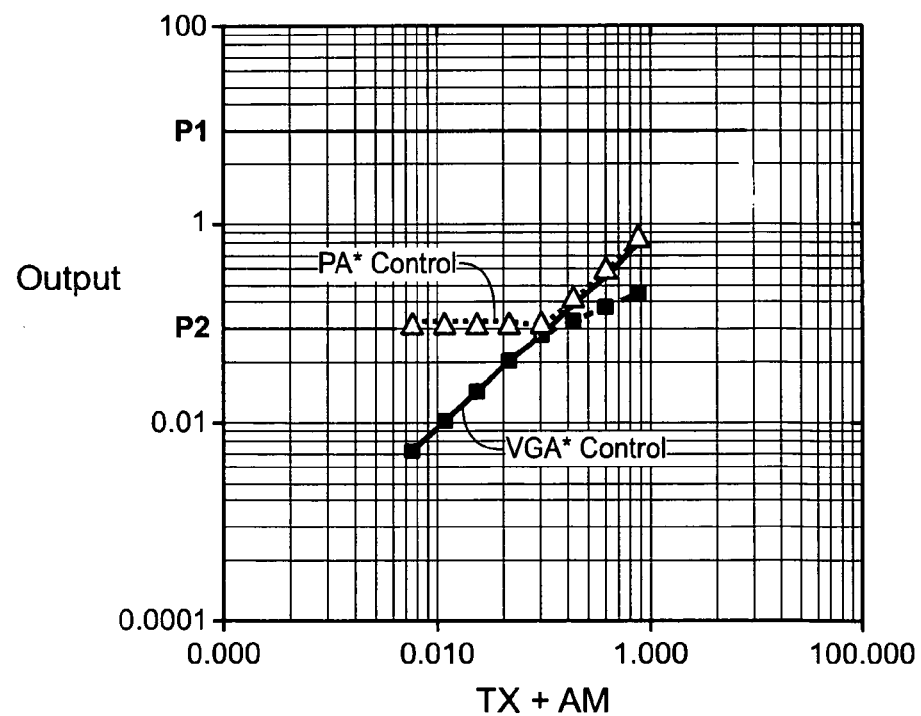
Figure 12D:
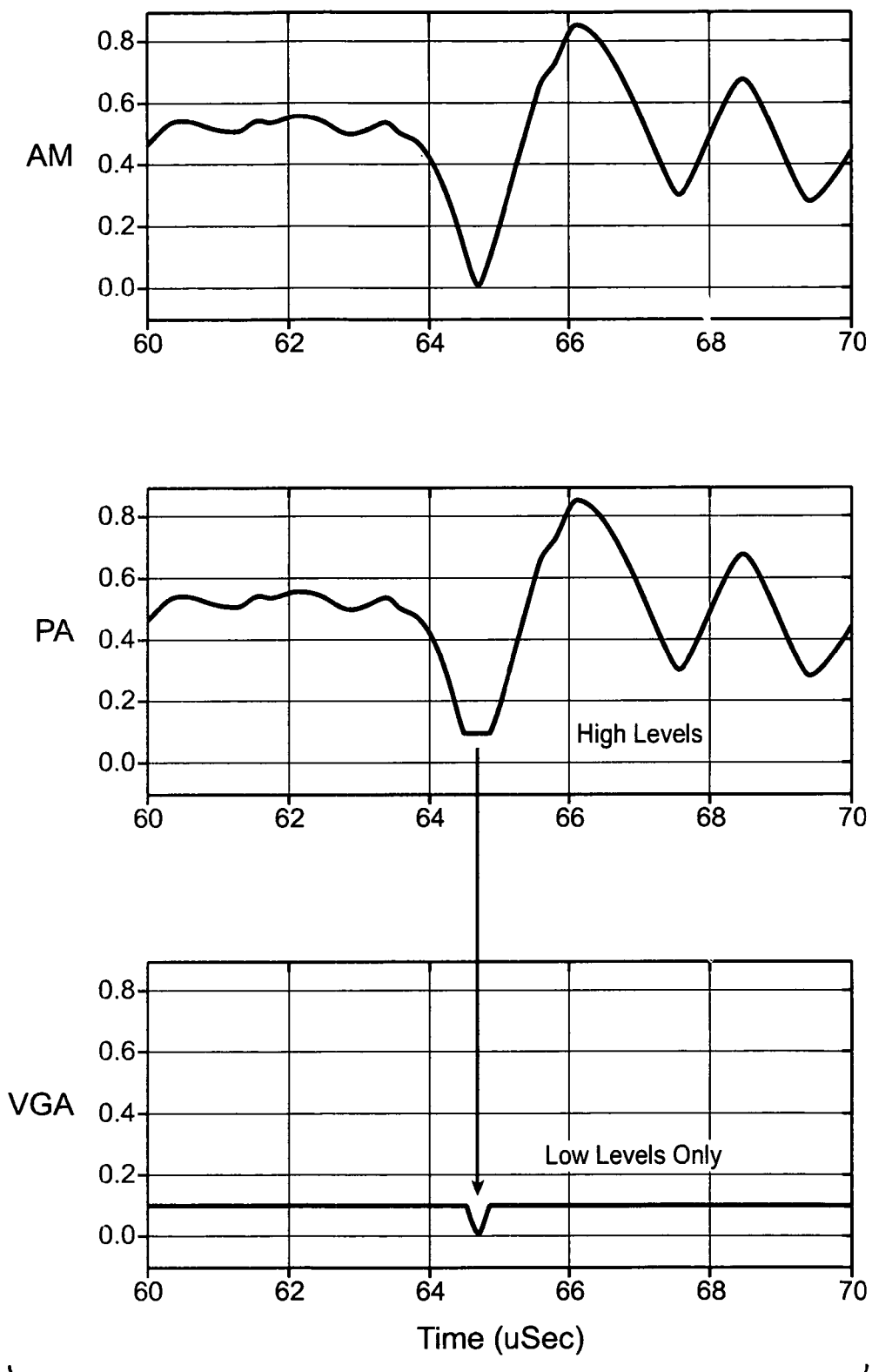

It should be noted that the processing circuit 1200 use the same limits for splitting the AM signal to the VGA* and PA* control signals. As such, it reduces any discontinuities in the transfer functions for these control signals as illustrated in the graph of FIG. 12*b*. These responses in turn produce the PA* and VGA* control signals shown in FIG. 12*c*. FIG. 12*d* shows an AM signal and resulting PA and VGA output signals.

Figure 13:
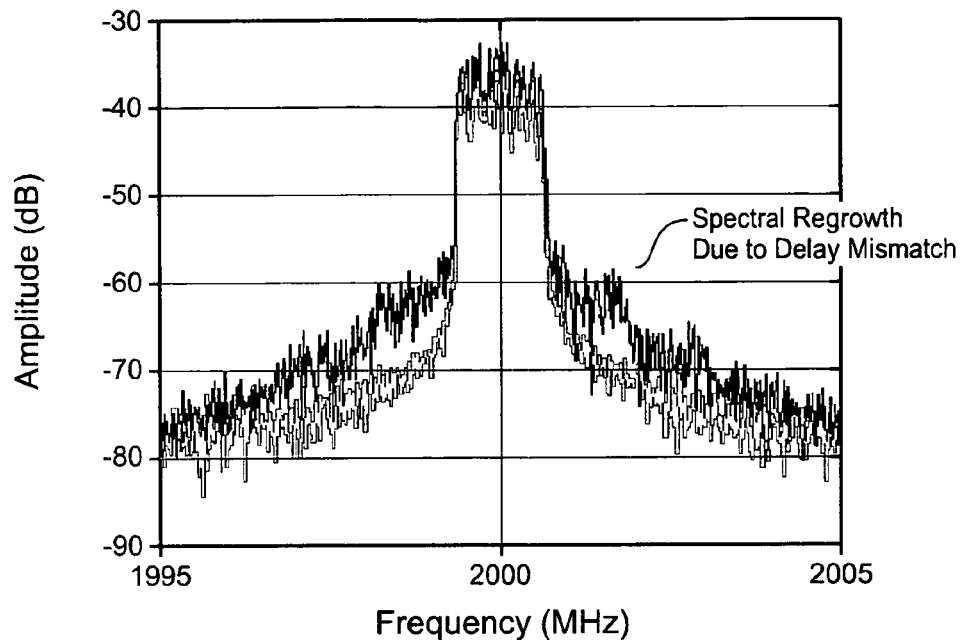
FIG. 13 shows a graph that illustrates the power spectral density with and without alignment of the phase and amplitude modulation signals.

The amplitude feedback loop also includes a low pass filter to ensure stability as well as to further attenuate the RF carrier signal that leaks through the peak detector. Its design is important because the phase and amplitude signals in a polar modulator must align, otherwise the modulated signal becomes distorted and spectral re-growth occurs as shown in the graph provided in FIG. 13. The signals plotted in FIG. 13 show the power spectral density (psd) of an ideal modulation signal, and a signal produced when the modulation signals (frequency and amplitude) are offset in time by a small amount.

Referring to the feedback loop shown in FIG. 11, its operation can be described by the following transfer function;

$$\frac{i_{det}}{i_{AM}} = \frac{\frac{k}{(1+s/p_1)}}{1 + \frac{\alpha k}{(1+s/p_1)(1+s/p_2)}}$$

where k is the power amplifier control gain, $\alpha$ is the detector gain, and $p_1$-$p_2$ are the pole frequencies of the low pass filter 1104 and detector filter, respectively. The power amplifier gain is set by the control current ($i_{PA}$) and is defined by;

$$k = \frac{v_{rf(pk)}}{i_{PA}}$$

where $v_{rf(pk)}$ is the peak transmit signal, less any coupling loss. Likewise, the detector is characterized by;

$$\alpha = \frac{i_{det}}{v_{rf(pk)}}$$

which is a linear relationship. Note that the pole frequency $p_2$ of the detector (and any other circuit) is intentionally set much higher than the pole frequency $p_1$ of the low pass filter. As a result, the transfer function for the feedback loop simplifies to;

$$\frac{i_{det}}{i_{AM}} = \frac{\beta}{1 + \frac{s}{p_1(1+\alpha k)}}$$

where $\beta$ is the dc gain equal to;

$$\beta = \frac{k}{1+\alpha k}$$

and $p_1(1+\alpha k)$ is the effective or dominant pole frequency of the system. With these conditions, the low pass filter not only stabilizes the feedback loop but also removes the carrier signal extracted by the detector. Furthermore, this effective pole frequency sets the delay of the amplitude modulation signal.

The feedback loop is active only between power levels $P_1$ to $P_2$. This is important because the detector is linear only in this range. Outside this range, the detector, the feedback loop, and the power amplifier become very nonlinear. Therefore, in one embodiment, the limit functions restrict and actually prevent the operation of the feedback loop outside the range of $P_1$ to $P_2$.

Figure 14:
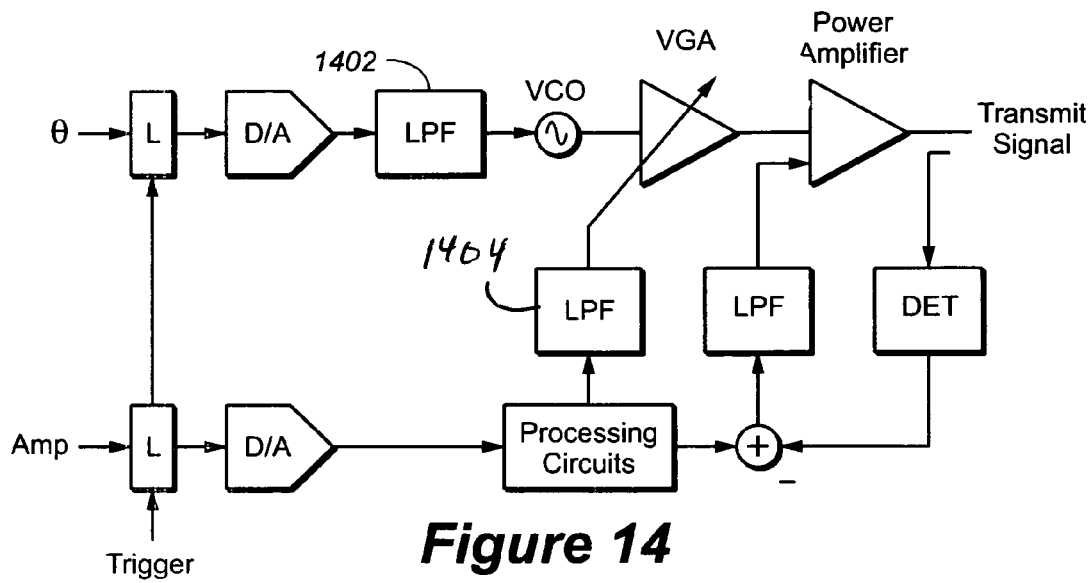
FIG. 14 shows one embodiment of a system for aligning the phase and amplitude signals in a polar modulator.

FIG. 14 shows one embodiment of a system for aligning the phase and amplitude signals in a polar modulator. The digital phase and amplitude input signals are captured by latches (L) and then applied to digital-to-analog (D/A) converters. In practice, the amplitude modulation must be delayed one-half cycle compared to the frequency modulation signal to realize the VCO phase shift. The latches align the digital data and thereby remove any prior or existing timing differences. In one embodiment, the phase modulation signal—in analog form—is filtered and then applied directly to the voltage-controlled oscillator (VCO) operating at the carrier frequency. This generates a constant-envelope phase-modulated signal that is then buffered by the variable gain driver (VGA). The delay of these circuits $t_D$ can be approximated by;

$$t_D \sim \frac{1}{2.5 f_{3dB}}$$

where the 3 dB bandwidth ($f_{3\,dB}$) is necessarily greater than the carrier frequency. This results in an insignificant delay compared to the rate of the amplitude modulation signal. Simultaneously, the amplitude modulation signal (in analog form) is also applied to the analog signal processing circuit and power amplifier control loop.

Now, to align the modulation signals, the phase modulation signal must be delayed by the same amount as the amplitude modulation signal. In one embodiment, a duplicate low pass filter 1402 is inserted in the phase modulation path prior to the voltage-controlled oscillator. Its transfer function is simply;

$$\frac{v_{out}}{i_{in}} = \frac{1}{(1+s/p_3)}$$

where $p_3$ represents the pole frequency and equals $p_1$ (1+αfl). This also corresponds to the pole frequency for the low pass filter 1404 connecting to the variable gain amplifier since it operates outside the feedback loop.

Figure 15:
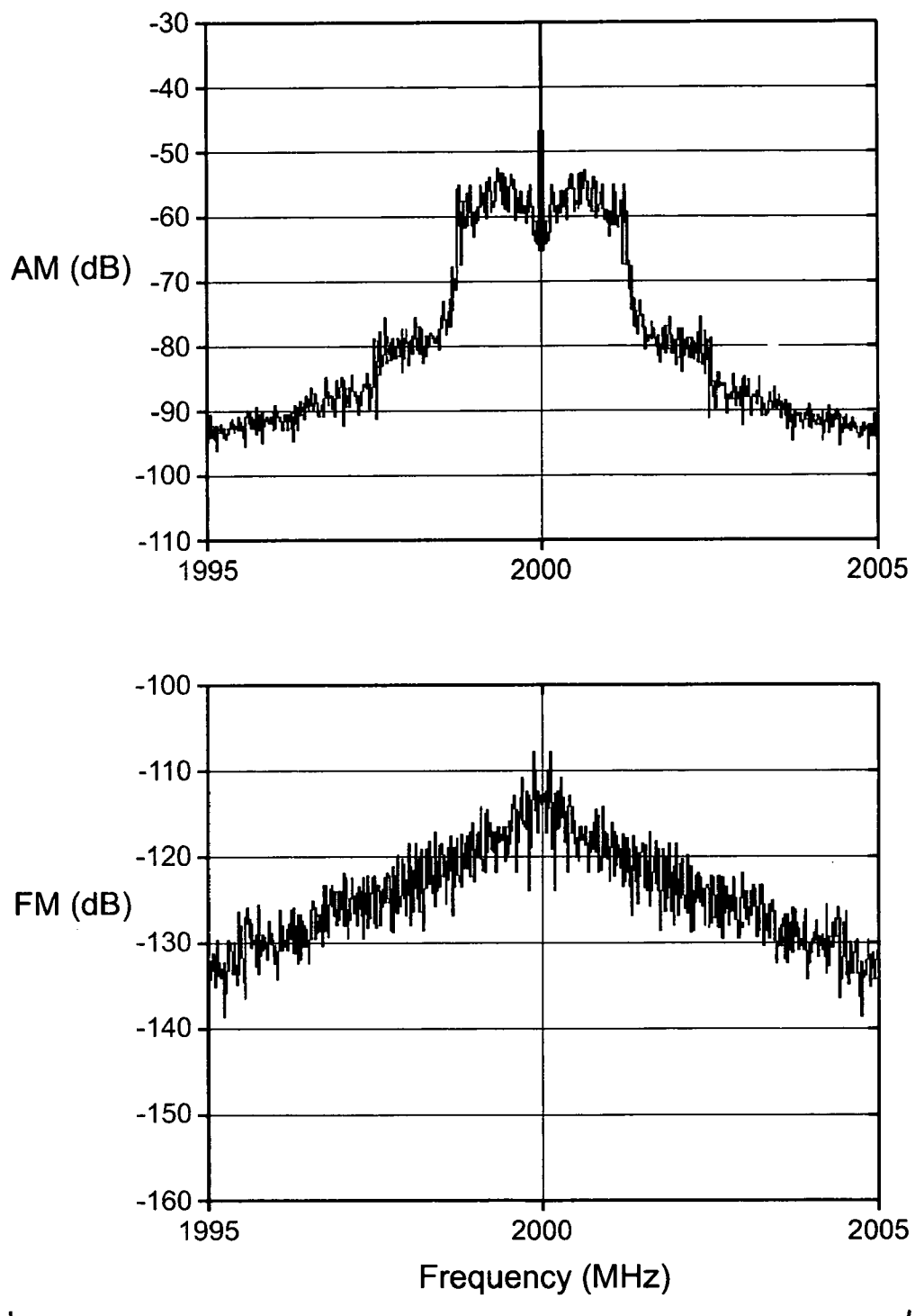
FIG. 15 shows graphs that illustrate power spectral density of frequency and amplitude modulation signals.

Some communication systems use modulation schemes with exceptionally wide frequency modulation as shown in the graphs illustrated in FIG. 15. (It's possible in some cases for the bandwidth of the frequency modulation to approach several times the bandwidth of the transmit signal.) This wide bandwidth causes problems and makes the design of the feedback loop difficult. Interestingly, the bandwidth of the amplitude modulation signal generally follows the spectrum of the transmit signal. As a result, the design of the feedback loop may be eased by setting the pole frequency of the amplitude and frequency modulation paths differently. The challenge then becomes alignment of the phase and amplitude modulation signals.

Figure 16:
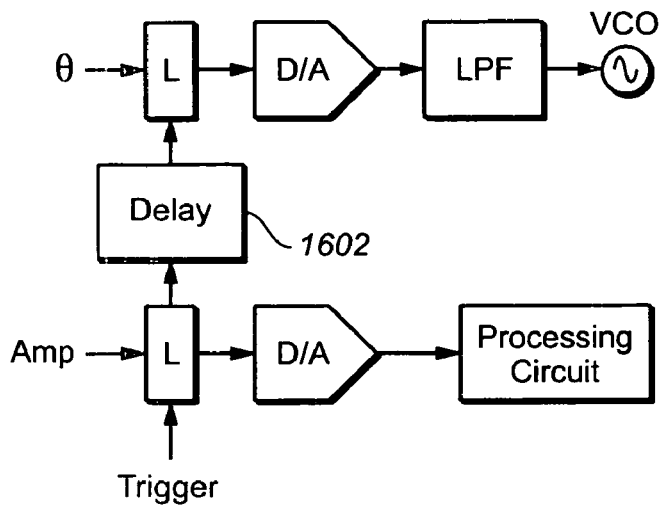
FIG. 16 shows one embodiment of a system for aligning the phase and amplitude signals in a polar modulator.

FIG. 16 shows one embodiment of a system for aligning the phase and amplitude signals in a polar modulator that comprises a digital delay circuit 1602 that allows the timing of the frequency modulation signal to be adjusted. It's expected that the narrower bandwidth of the amplitude feedback loop introduces additional delay that needs to and can be compensated for by the delay element 1602.

Figure 17:
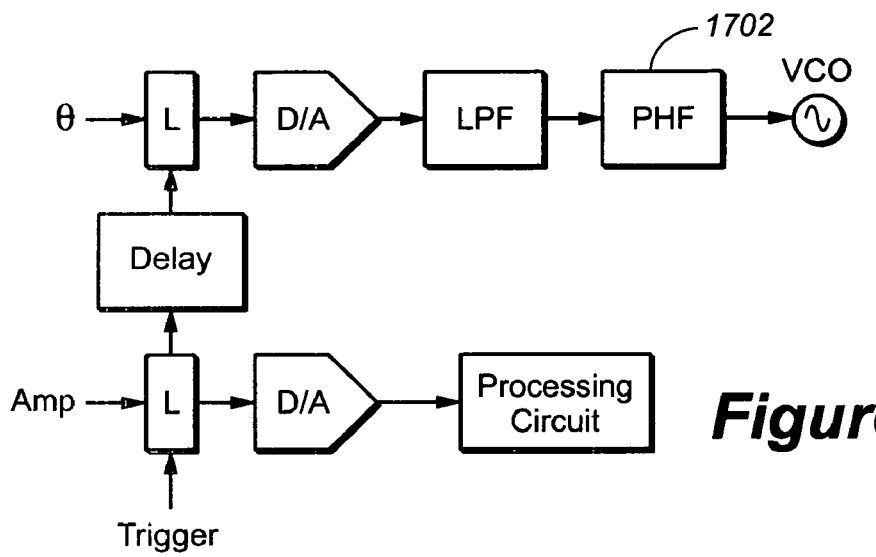
FIG. 17 shows one embodiment of a system for aligning the phase and amplitude signals in a polar modulator.

FIG. 17 shows one embodiment of a system for aligning the phase and amplitude signals in a polar modulator that comprises a digital delay circuit that uses a phase equalization filter 1702 before the VCO to exactly match the delay of the filter in the amplitude feedback loop.

Figure 18A:
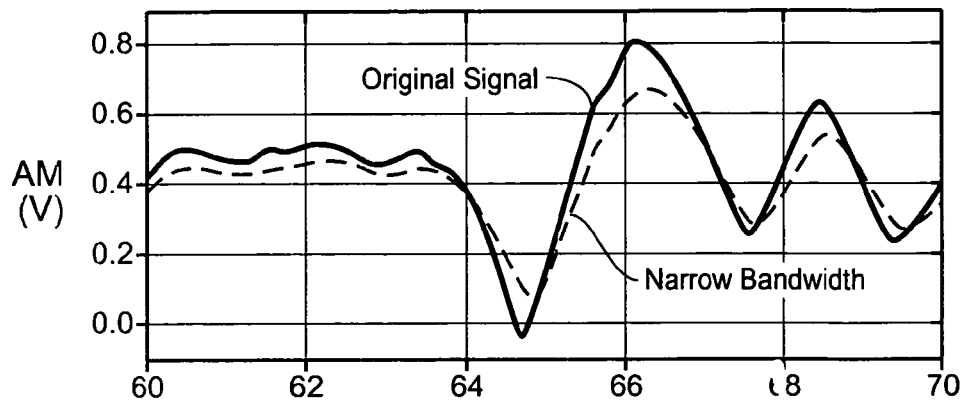
FIGS. 18a-d show graphs that illustrate one embodiment of a method to compensate for the effects of a narrow filter.
Figure 18B:
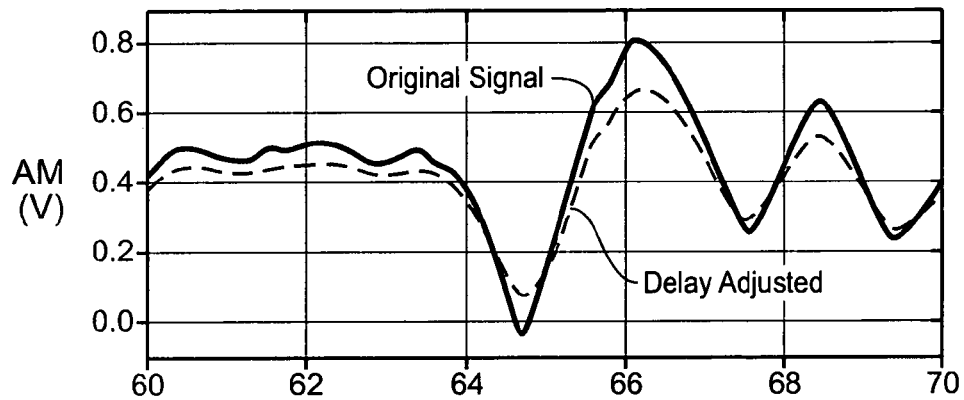
Figure 18C:
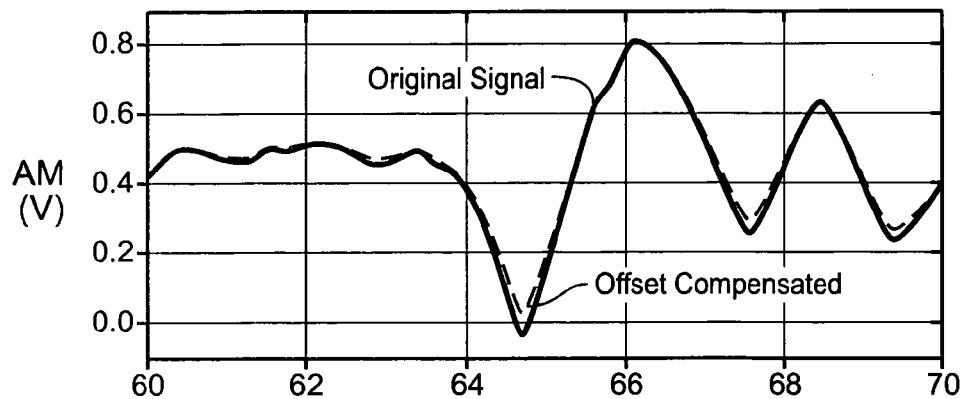
Figure 18D:
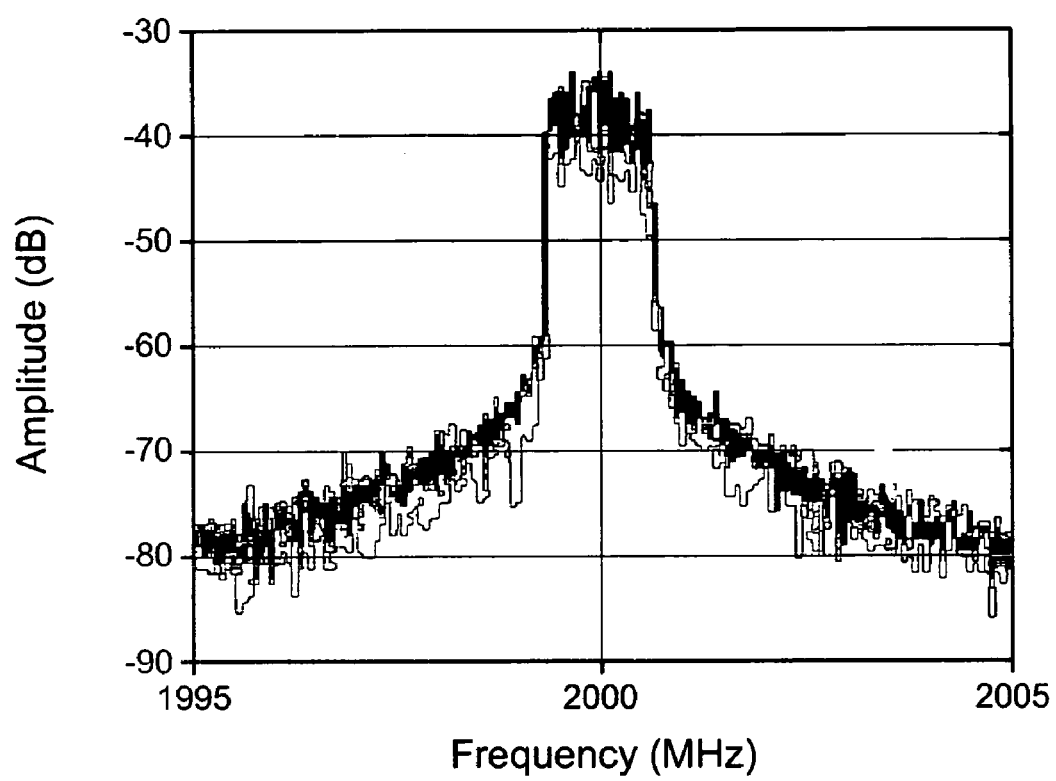

FIGS. 18a-d show graphs that illustrate the operation of one embodiment of a method to compensate for the effects of a narrow filter. For example, systems with narrow filters that attenuate the modulation signals generally need compensation or pre-distortion. That's because these filters severely limit the nulls in the modulation signal as shown in the graph of FIG. 18a. The nulls occur when the signal trajectory abruptly passes through the I/Q origin and thus maps to higher frequencies. It's possible to counteract this effect by advancing the signal as shown in the graph of FIG. 18b, and then shifting the signal towards zero as shown in the graph of FIG. 18c. The resulting signal can also be rescaled to recover any lost signal amplitude. This advantageously reduces spectral re-growth as illustrated by the graph shown in FIG. 18d.

The feedback loop and processing circuit shown in FIG. 11 utilize a variety of functions to split and/or process the amplitude modulation signal. These functions can be realized as digital and/or analog circuits. Any digital implementation is generally straightforward while an analog implementation is more challenging as described below. The first of these circuits is an exponential generator (EXP), which translates the TX control signal (typically in dB) to linear format.

Figure 19:
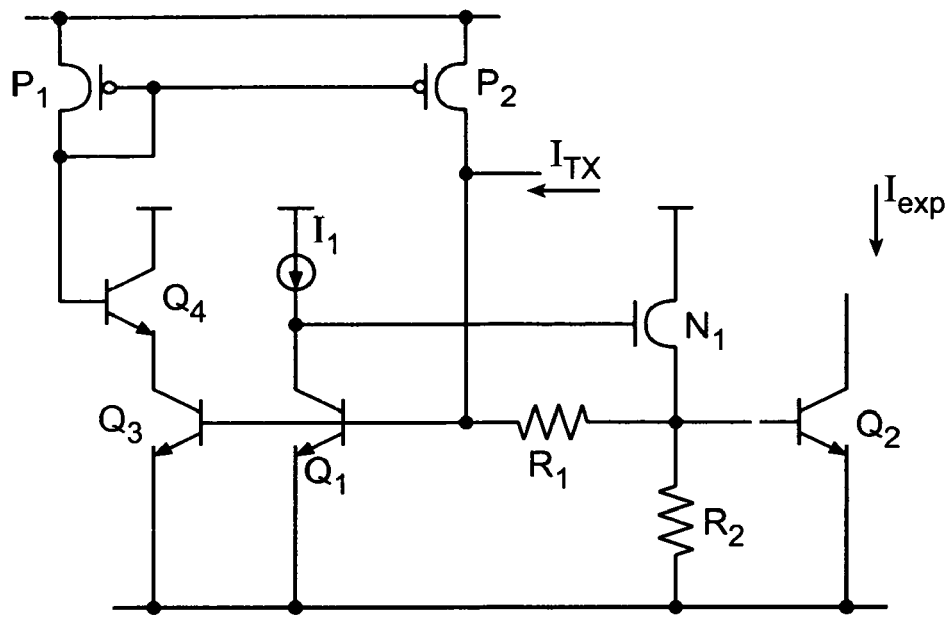
FIG. 19 shows one embodiment of an EXP circuit.
Figure 20:
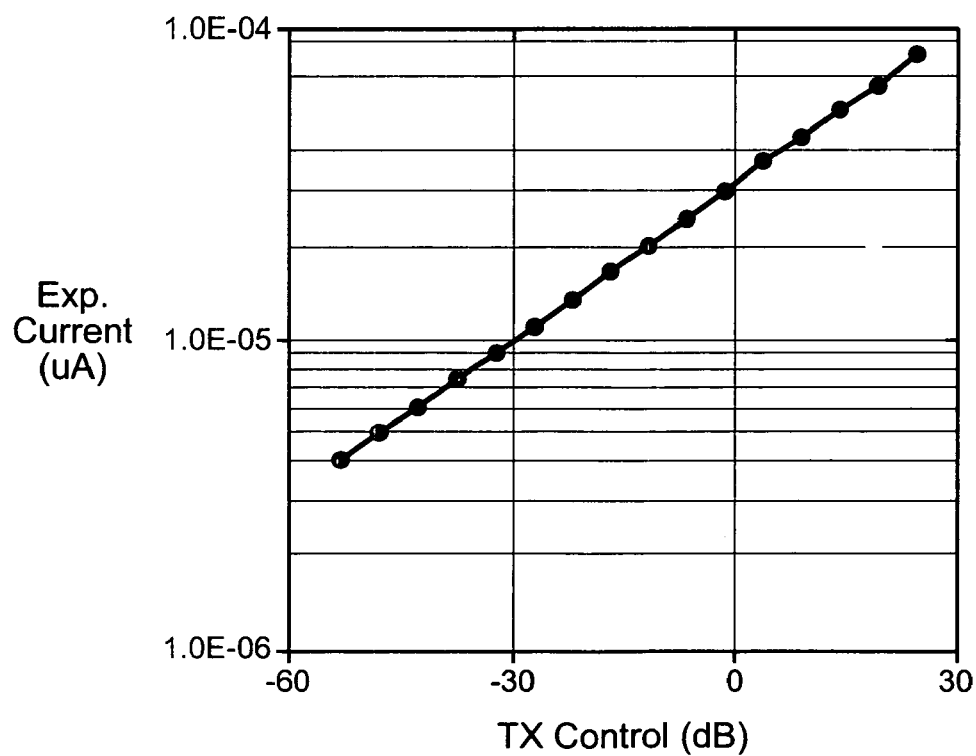
FIG. 20 shows a graph that illustrates the operation of the EXP circuit shown in FIG. 19.

FIG. 19 shows one embodiment of an EXP circuit and FIG. 20 shows a graph of its operation. Referring to FIG. 19, a current $I_1$ develops a base-emitter voltage across transistor $Q_1$ that mirrors to transistor $Q_2$ through resistor $R_1$. The resulting loop equation is;

$$V_{be1} = I_{Tx}R_1 + V_{be2}$$

where $I_{Tx}$ is the power control signal (and is proportional to the required gain). This equation can be rewritten as;

$$I_{exp} = I_1 \exp\left(-\frac{I_{Tx}R_1}{V_T}\right)$$

where $V_T$ is the thermal voltage. FIG. 20 illustrates the resulting exponential current ($I_{exp}$).

Referring again to FIG. 19, the transistor loop comprising devices $Q_3$-$Q_4$ and transistors $P_1$-$P_2$, biases transistor $Q_1$, while transistor $N_1$ provides the base current for transistor $Q_2$. Resistor $R_2$ provides a current source for transistor $N_1$.

By design, the exponential current $I_{exp}$ maps to the same scale as the amplitude modulation signal and above-defined power levels $P_1$ and $P_2$. This is important because it allows the signals to be easily compared by the min and max circuits described above.

Figure 21:
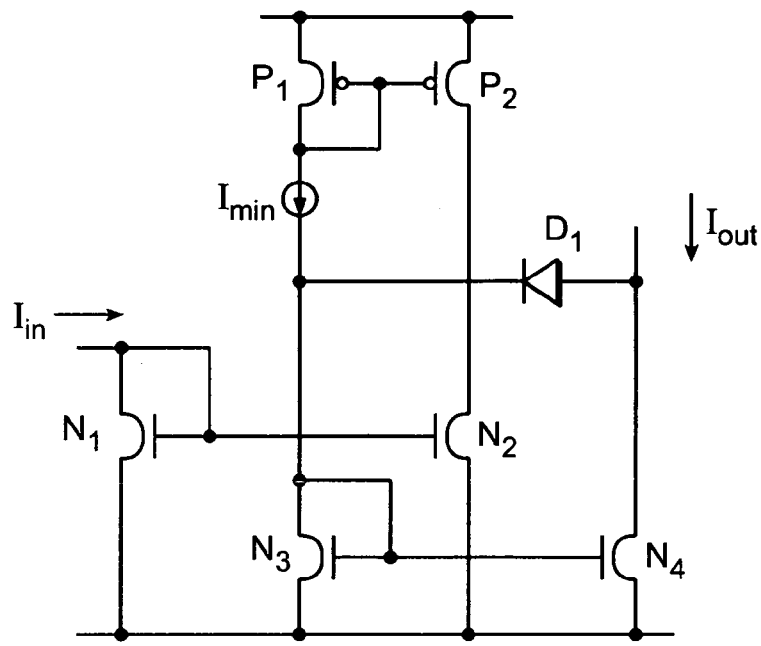
FIG. 21 shows one embodiment of a minimum circuit.
Figure 22:
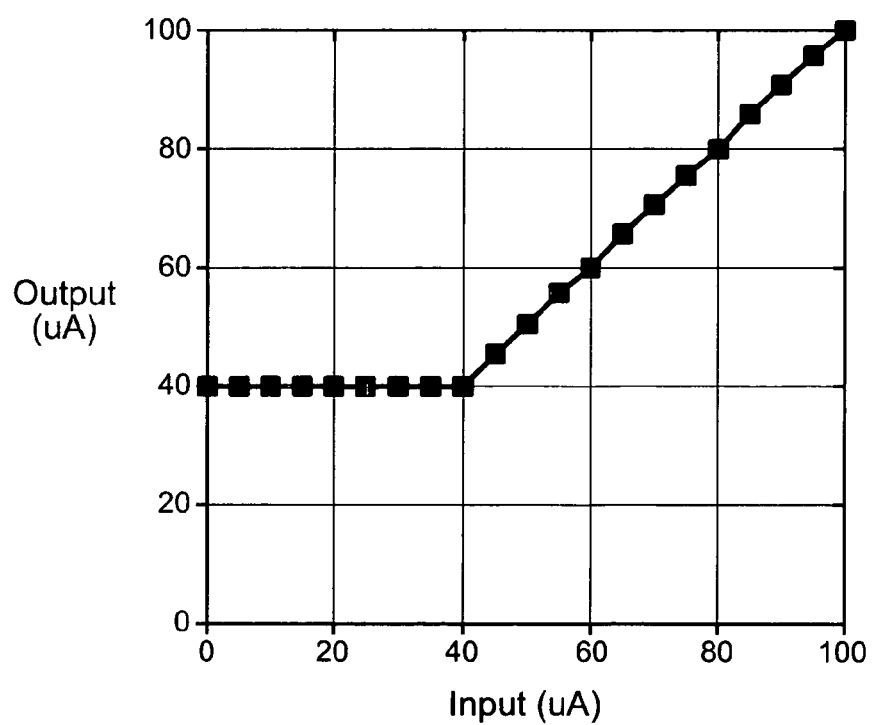
FIG. 22 shows a graph that illustrates the operation of the minimum circuit shown in FIG. 21.

FIG. 21 shows one embodiment of a minimum (min) circuit. It prevents the input current from falling below the current $I_{min}$. A set of three current mirrors establishes current $I_{in}$ in transistor $N_2$ and current $I_{min}$ in transistors $N_4$ and $P_2$. The diode $D_1$ remains biased off until the current $I_{in}$ exceeds the current $I_{min}$, at which point, the excess current $I_{in}$-$I_{min}$ flows through the diode $D_1$ from the output. As a result, the output current $I_{out}$ follows the current $I_{in}$ at high levels but flattens out (to the level of $I_{min}$) at low levels of current $I_{in}$ as shown in the graph provided in FIG. 22.

Figure 23:
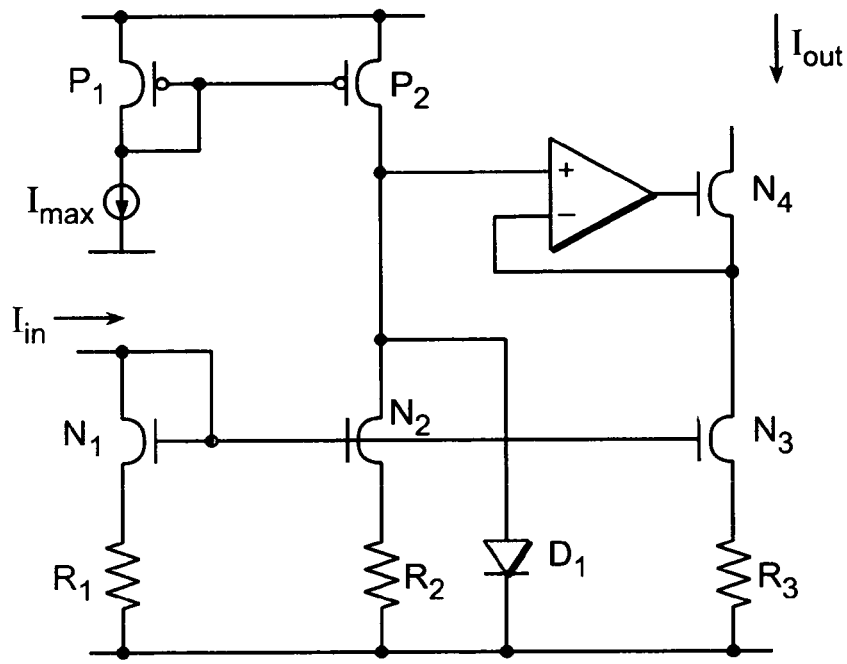
FIG. 23 show a maximum circuit.
Figure 24:
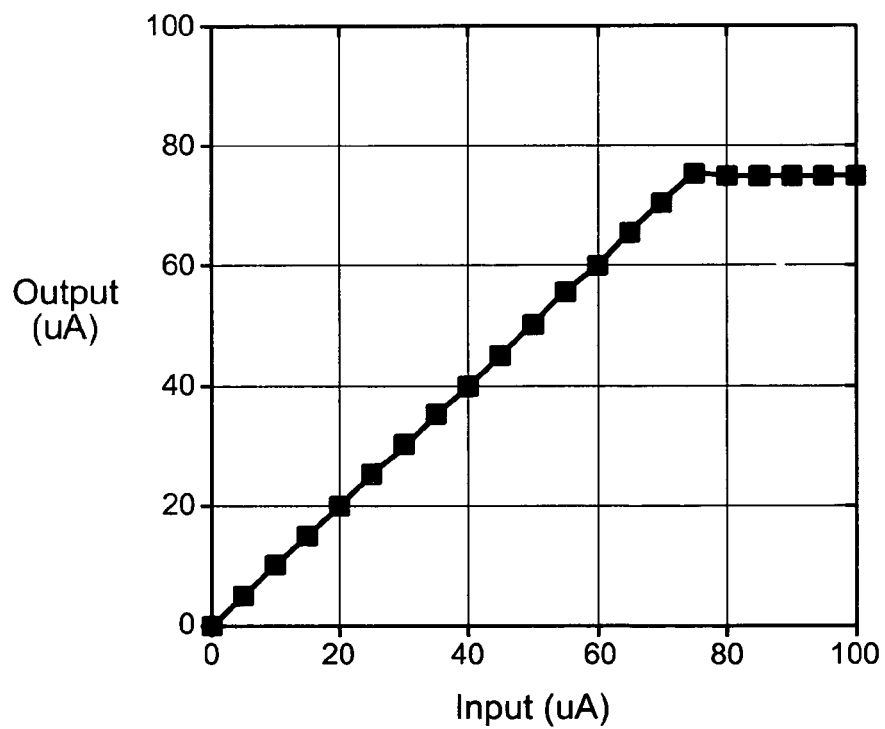
FIG. 24 shows a graph illustrates the operation of the maximum circuit shown in FIG. 23.

FIG. 23 shows one embodiment of a maximum (max) circuit. It limits the output current to a maximum level equal to the current $I_{max}$. A current mirror establishes the current $I_{in}$ in devices $N_2$ and $N_3$. A similar current mirror (transistors $P_1$-$P_2$) sets the current $I_{max}$. The diode $D_1$ provides a path for the excess current when current $I_{max}$ is larger than current $I_{in}$ and sets the voltage at the non-inverting input to the operational amplifier (plus the voltage at the drain of transistor $N_3$). When the current $I_{in}$ exceeds the current $I_{max}$, transistor $N_2$ is pushed into triode region to limit its current to $I_{max}$. The operational amplifier forces the voltage at the drain of transistor $N_3$ to follow the voltage at the drain of transistor $N_2$ so that transistor $N_3$ also limits to the current $I_{max}$. Degeneration resistors are added to the NMOS current mirrors (devices $N_1$-$N_3$) to increase the sensitivity of the network as the drain-source voltage decreases (in triode region). As a result, the output current $I_{out}$ equals the input current $I_{in}$ to a maximum level of $I_{max}$, where it flattens out as shown in a graph provided in FIG. 24.

Referring again to FIG. 11, the detector (DET) is a ver) important functional element in the feedback loop. Ideally, it provides a linear response and thereby follows the envelope of the transmit output signal.

Figure 25:
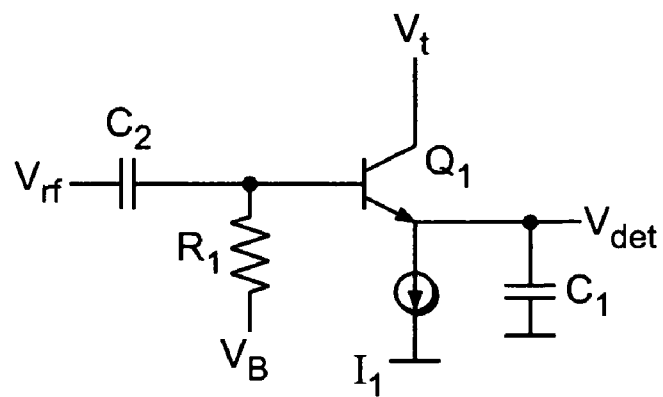
FIG. 25 shows one embodiment of a detector.

FIG. 25 shows one embodiment of a detector. Transistor $Q_1$ rectifies the input signal according to;

$$i_{C1} = I_{S1} \exp\left(\frac{v_{rf} + V_B - v_{det}}{V_T}\right)$$

where $i_{C1}$ and $I_{S1}$ are the collector and saturation currents of the transistor, respectively, $v_{rf}$ is the input signal with amplitude A, $V_B$ is the base bias voltage, and $v_{det}$ is the output voltage developed across capacitor $C_1$. The peaks of the input signal are held by capacitor $C_1$, although some droop $\Delta v$ occurs between these peaks, with;

$$\Delta v_{det} = -\frac{I_1}{C_1} \Delta t$$

Figure 26:
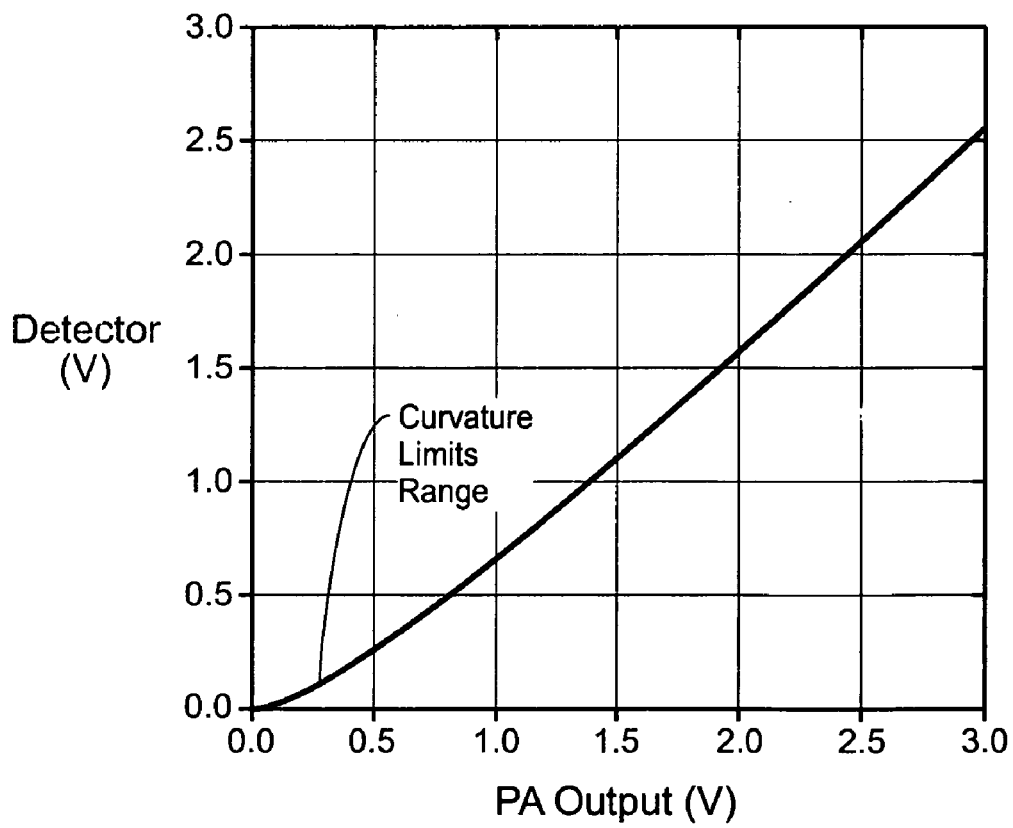
FIG. 26 shows a graph that illustrates the operation of the detector of FIG. 25.
Figure 27:
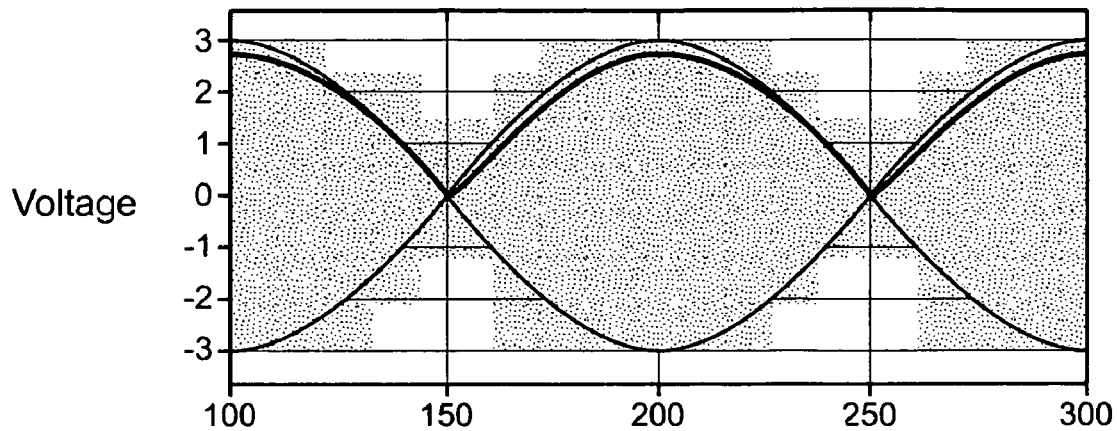
FIG. 27 shows a graph that illustrates the operation of the detector of FIG. 25.
Figure 28:
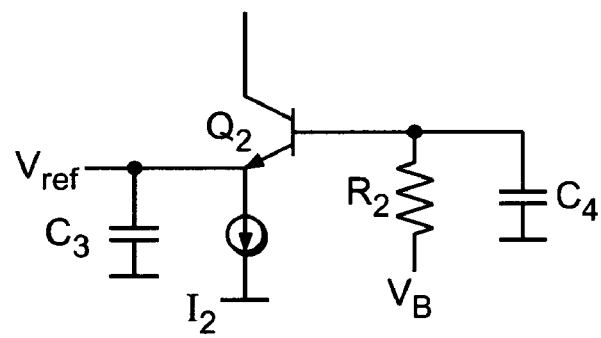
FIG. 28 shows one embodiment of a circuit that replicates the linear detector of FIG. 25 and provides a temperature compensated reference.
Figure 29:
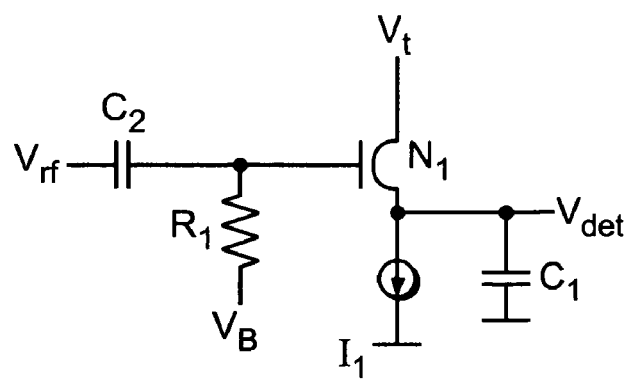
FIG. 29 shows another embodiment of a detector based on MOS technology.

$I_1$ is the bias current, and $\Delta t$ is approximately one-half of the carrier (or radio) frequency. Some droop is acceptable, since the envelope of the radio frequency signal changes slowly compared to the carrier signal. The circuit strives for equilibrium where the average current flowing through transistor $Q_1$ is simply $I_1$. This requires the voltage held by capacitor $C_1$ to track the positive peaks (and effectively the envelope) of the radio signal as shown in the graph provided by FIG. 26. As a result, the detector responds linearly to input signals over a range of about 20 dB and adheres to the expression;

$$v_{det} = A + V_B - V_{beq} + V_T \ln\sqrt{\frac{2\pi A}{V_T}}$$

as shown in the graph provided by FIG. 27. Ideally, the bias voltage $V_B$ shown in FIG. 25 cancels the quiescent base-emitter voltage of transistor $Q_1$. Alternatively, FIG. 28 shows one embodiment of a circuit that replicates the linear detector and provides a temperature compensated reference ($V_{ref}$). FIG. 29 shows another embodiment of a detector based on MOS technology.

Figure 30:
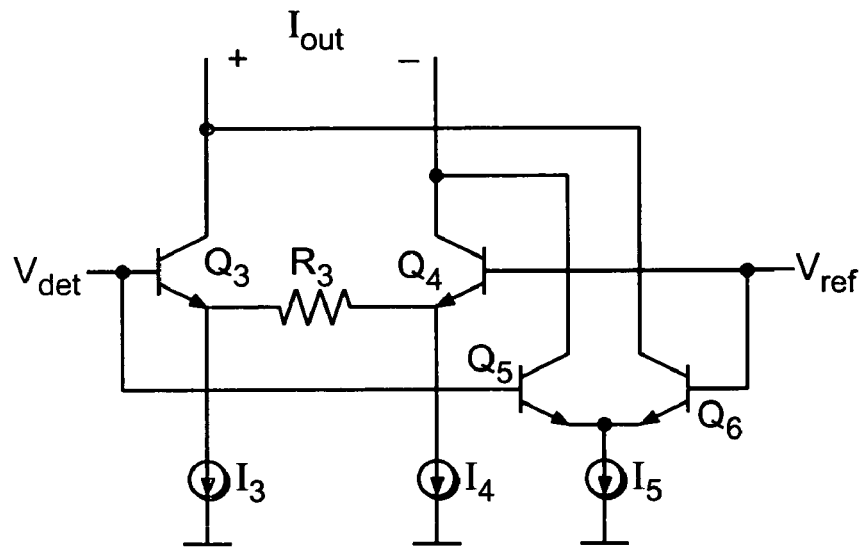
FIG. 30 shows one embodiment of a transconductance amplifier.

The detector output voltage may be translated to an output current so that it readily interfaces to the processing circuits described herein. FIG. 30 shows one embodiment of a transconductance amplifier that operates to translate the detector output voltage to an output current. For example, the circuits shown in FIG. 25 and FIG. 28 feed the transconductance amplifier shown in FIG. 30. Transistor. $Q_3$ and $Q_4$, resistor $R_3$, and current sources $I_3$ and $I_4$ form a linear differential gain stage with output currents described by;

$$i_3 = I_3 + i_{det}, \quad i_4 = I_4 - i_{det}$$

where $i_3$ and $i_4$ are the collector currents of transistors $Q_3$ and $Q_4$, respectively. The current $i_{det}$ is described by;

$$i_{det} = \frac{v_{det} - V_{ref}}{R_3}$$

for $v_{det}$ less than or equal to $I_4 R_3$.

Figure 31:
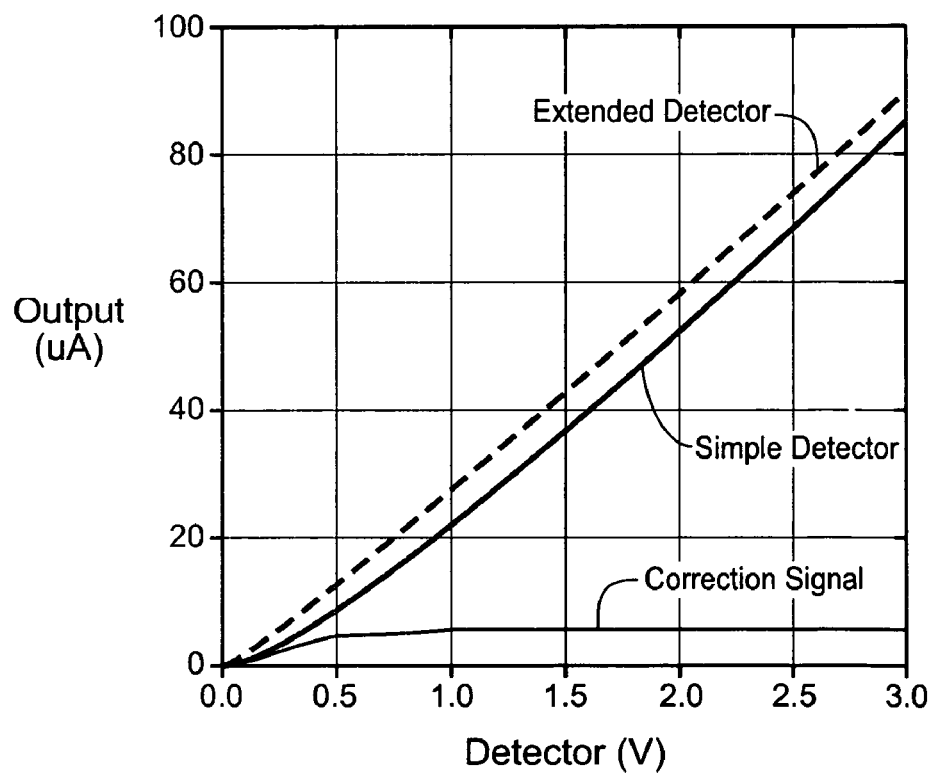
FIG. 31 shows a graph that illustrates the operation of the transconductance amplifier shown in FIG. 30.

Transistors $Q_3$ and $Q_4$ with current source $I_5$ form a simple differential pair where $$i_5 = \frac{I_5}{1 + \exp\left(\frac{V_{ref} - v_{det}}{V_T}\right)} \qquad i_6 = \frac{I_5}{1 + \exp\left(\frac{v_{det} - V_{ref}}{V_T}\right)}$$

which is cross-coupled to the previous outputs ($i_3$ and $i_4$). Since current source $I_5$ is significantly smaller than current sources $I_3$ and $I_4$, the cross-coupled currents actually reduce the transconductance amplifier's gain at low input levels. This in turn effectively reduces the offset produced by the detector and extends its range beyond 30 dB to approximately 35 dB as illustrated by the graph shown in FIG. 31. In other embodiments, it is also possible to use MOS transistors to realize the transconductance amplifier.

In one or more embodiments, a system for linear amplitude modulation is provided that improves the efficiency of power amplifiers that can be used for various types of modulated signals, including constant and envelope-varying schemes. The system utilizes a feedback loop to linearize the response of these power amplifiers as well as an advanced gain control system to scale the amplitude modulation. The result is a robust and very efficient amplitude modulation system that may be used in radio transmitters or any other system or application that requires linear amplitude modulation.

Accordingly, while one or more embodiments of a system for linear amplitude modulation have been illustrated and described herein, it will be appreciated that various changes can be made to the embodiments without departing from their spirit or essential characteristics. Therefore, the disclosures and descriptions herein are intended to be illustrative, but not limiting, of the scope of the invention, which is set forth in the following claims.

What is claimed is:

1. Apparatus for linear amplitude modulation of a multi-stage amplifier, the apparatus comprising:

a processing circuit that receives an amplitude modulation signal and a transmit control signal and produces at a first output a first amplifier control signal to control a first stage of the multi-stage amplifier and at a second output a second amplifier control signal to control a second stage of the multi-stage amplifier;

a detector circuit coupled to the output of the multi-stage amplifier to generate, at an output, a signal representing the output of the multi-stage amplifier;

a summing circuit having a first input coupled to the second output of the processing circuit to receive the second amplifier control signal and a second input coupled to the output of the detector circuit; and a network coupled to an output of the summing circuit to controls a bias or a gain signal of the multi-stage amplifier to linearize the amplifier's amplitude control.

2. The Apparatus of claim 1 further comprising a first lowpass filter coupled to the first output of the processing circuit and a first stage of the multi-stage amplifier.

3. The Apparatus of claim 2 wherein the first stage is a VGA stage.

4. The Apparatus of claim 1 wherein the network comprises a lowpass filter and a bias circuit, wherein the lowpass filter is coupled to the output of the summing circuit and an input of the bias circuit and wherein an output of the bias circuit is coupled to a second stage of the multi-stage amplifier.

5. The Apparatus of claim 4 wherein the second stage of the multi-stage amplifier comprises a power amplifier stage.

6. The Apparatus of claim 1 wherein the processing circuit comprises a plurality of min and max circuits configured to generate the first amplifier control signal and the second amplifier control signal.

7. The Apparatus of claim 6 wherein the first amplifier control signal is designated VGA* and the second amplifier control signal is designated PA*, with VGA* generated in accordance with a relationship governed by:

VGA*=AM for AM<(P2−TX);

VGA*=P2+u(PA*) for (P2−TX)>=AM<=(P1−TX); and

VGA*=P2+u(Delta P2)+(AM−P1) for AM>(P1−TX); and wherein AM is a signal proportional to the amplitude modulation signal, P1 is a power level at which amplifier control through the bias network or voltage supply may be effected, P2 is the absolute lower limit of the amplifier's modulation range, u is a scaling factor, and TX is the transmit output power level set by the transmit control signal.

8. The Apparatus of claim 6 wherein the second amplifier control signal is designated PA*, with PA* generated in accordance with a relationship governed by:

$$PA^* = P2 \text{ for } AM < (P2-TX)$$

$$PA^* = AM + TX \text{ for } (P2-TX) >= AM <= (P1-TX); \text{ and}$$

$$PA^* = P1 \text{ for } AM > (P1-TX); \text{ and}$$

wherein AM is a signal proportional to the amplitude modulation signal, P1 is a power level at which amplifier control through the bias network or voltage supply may be effected, P2 is the absolute lower limit of the amplifier's modulation range, and TX is the transmit output power level set by the transmit control signal.

9. The Apparatus of claim 1 further comprising:
a duplicate lowpass filter coupled between a phase or frequency modulated input signal and a VCO coupled to the multi-stage amplifier, wherein the network comprises a lowpass filter, and wherein said duplicate lowpass filter is configured to match a set of filter characteristics of the lowpass filter.

10. The Apparatus of claim 1 further comprising:
an alignment circuit coupled to an input AM signal, an input PM or FM signal, the processing circuit and a VCO coupled to the multi-stage amplifier, wherein said amplitude alignment circuit is configured to delay the input AM signal or input PM or FM signal to compensate for time delays in the AM or PM or FM signal paths.

11. The Apparatus of claim 10 wherein the alignment circuit comprises a delay circuit configured to adjust the timing of the PM or FM signal.

12. The Apparatus of claim 11 wherein the delay circuit comprises a digital delay circuit.

13. The Apparatus of claim 10 wherein the alignment circuit comprises a digital delay circuit including a phase equalization filter coupled to the VCO and the FM or PM signal to match the delay of a filter in the network.

14. The Apparatus of claim 10 wherein the alignment circuit is configured to compensate for narrowband AM distortion.

15. The Apparatus of claim 14 wherein the alignment circuit is configured to compensate for narrowband AM distortion by:
receiving an original AM signal;
advancing the original AM signal; and
shifting the advanced signal towards a zero value to generate a compensated AM signal.

16. The Apparatus of claim 15 wherein the alignment circuit is further configured to rescale the compensated AM signal to approximate the original AM signal amplitude.

17. The Apparatus of claim 1 wherein the detector circuit is configured to provide a linear response signal to follow the envelope of the multi-stage amplifier output signal.

18. The Apparatus of claim 17 wherein the detector comprises:
an input capacitor coupled to a voltage signal, said voltage signal replicating the multi-stage amplifier output signal;
a resistor coupled to the capacitor and a bias voltage signal;
a transistor coupled to the input capacitor and resistor;
a diode coupled to the transistor; and
an output capacitor coupled to the transistor and diode to hold the peaks of the voltage signal.

19. The Apparatus of claim 18 wherein the transistor comprises a bipolar junction transistor (BJT).

20. The Apparatus of claim 18 wherein the transistor comprises a field effect transistor (FET).

21. The Apparatus of claim 17 further comprising a temperature compensated reference.

22. The Apparatus of claim 17 further comprising a transconductance circuit coupled to the detector circuit to translate a detector output voltage to an output current.

23. A method for amplitude modulating a multi-stage amplifier, comprising:
receiving, at a processing circuit, an amplitude modulation signal and a transmit control signal;
providing a first output from the processing circuit to a first stage of the multi-stage amplifier to selectively amplitude modulate the first stage;
providing a second output from the processing circuit to a summing circuit;
combining, in the summing circuit, the second output with an output of a detector circuit coupled to an output of the multi-stage amplifier to generate a summing circuit output; and
providing the summing circuit output to a network and the second stage to selectively amplitude modulate the second stage;
wherein the first output signal is designated VGA* and the second amplifier control signal is designated PA*, with VGA* generated in accordance with a relationship governed by:

$$VGA^* = AM \text{ for } AM < (P2-TX);$$

$$VGA^* = P2 + u(PA^*) \text{ for } (P2-TX) >= AM <= (P1-TX); \text{ and}$$

$$VGA^* = P2 + u(\text{Delta } P2) + (AM - P1) \text{ for } AM > (P1-TX); \text{ and}$$

wherein AM is a signal proportional to the amplitude modulation signal, P1 is a power level at which amplifier control through the bias network or voltage supply may be effected, P2 is the absolute lower limit of the amplifier's modulation range, u is a scaling factor, and TX is the transmit output power level set by the transmit control signal.

24. The method of claim 23 further comprising aligning the amplitude modulation signal with a corresponding PM or FM signal to compensate for time delays in the AM or FM or PM signal paths.

25. The method of claim 24 wherein said aligning is performed by a delay circuit configured to delay the PM or FM signal.

26. The method of claim 25 further comprising applying the FM or PM signal to a phase equalization filter coupled to the VCO to match the delay of a filter in the network.

27. The method of claim 24 wherein said aligning is performed to compensate for narrowband AM distortion.

28. The method of claim 27 wherein the aligning includes:
receiving an original amplitude modulation signal;
advancing the original amplitude modulation signal to generate an advanced AM signal; and
shifting the advanced AM signal towards a zero value to generate a compensated AM signal.

29. The method of claim 28 wherein the aligning further includes rescaling the compensated AM signal to approximate the original AM signal amplitude.

30. The method of claim 23 wherein the detector circuit provides an output as a linear response signal generated to follow the envelope of the multi-stage amplifier output signal.

31. The method of claim 30 further comprising providing, in the detector circuit, a temperature compensated reference.

32. The method of claim 23 further comprising translating the detector output from a voltage to a current, and providing the current to the summing circuit.

33. A method for amplitude modulating a multi-stage amplifier, comprising:
   receiving, at a processing circuit, an amplitude modulation signal and a transmit control signal;
   providing a first output from the processing circuit to a first stage of the multi-stage amplifier to selectively amplitude modulate the first stage;
   providing a second output from the processing circuit to a summing circuit;
   combining, in the summing circuit, the second output with an output of a detector circuit coupled to an output of the multi-stage amplifier to generate a summing circuit output; and
   providing the summing circuit output to a network and the second stage to selectively amplitude modulate the second stage;
   wherein the second output signal is designated PA*, with PA* generated in accordance with a relationship governed by:

$PA^* = P2$ for $AM < (P2 - TX)$ $PA^* = AM + TX$ for $(P2 - TX) >= AM <= (P1 - TX)$; and $PA^* = P1$ for $AM > (P1 - TX)$; and wherein AM is a signal proportional to the amplitude modulation signal, P1 is a power level at which amplifier control through the bias network or voltage supply may be effected, P2 is the absolute lower limit of the amplifier's modulation range, and TX is the transmit output power level set by the transmit control signal.

34. The method of claim 33 further comprising aligning the amplitude modulation signal with a corresponding PM or FM signal to compensate for time delays in the AM or FM or PM signal paths.

35. The method of claim 34 wherein said aligning is performed by a delay circuit configured to delay the PM or FM signal.

36. The method of claim 35 further comprising applying the FM or PM signal to a phase equalization filter coupled to the VCO to match the delay of a filter in the network.

37. The method of claim 34 wherein said aligning is performed to compensate for narrowband AM distortion.

38. The method of claim 37 wherein the aligning includes:
   receiving an original amplitude modulation signal;
   advancing the original amplitude modulation signal to generate an advanced AM signal; and
   shifting the advanced AM signal towards a zero value to generate a compensated AM signal.

39. The method of claim 38 wherein the aligning further includes rescaling the compensated AM signal to approximate the original AM signal amplitude.

40. The method of claim 33 wherein the detector circuit provides an output as a linear response signal generated to follow the envelope of the multi-stage amplifier output signal.

41. The method of claim 40 further comprising providing, in the detector circuit, a temperature compensated reference.

42. The method of claim 33 further comprising translating the detector output from a voltage to a current, and providing the current to the summing circuit.

* * * * *